United States Patent
Miyazaki et al.

(10) Patent No.: US 10,050,106 B2
(45) Date of Patent: Aug. 14, 2018

(54) MANUFACTURING METHOD FOR SEMICONDUCTOR DEVICE

(71) Applicant: FUJI ELECTRIC CO., LTD., Kawasaki-shi (JP)

(72) Inventors: Masayuki Miyazaki, Matsumoto (JP); Takashi Yoshimura, Matsumoto (JP); Hiroshi Takishita, Matsumoto (JP); Hidenao Kuribayashi, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 15/172,273

(22) Filed: Jun. 3, 2016

(65) Prior Publication Data
US 2016/0284796 A1 Sep. 29, 2016

Related U.S. Application Data

(62) Division of application No. 14/372,453, filed as application No. PCT/JP2013/059775 on Mar. 29, 2013, now Pat. No. 9,385,211.

(30) Foreign Application Priority Data

Mar. 30, 2012 (JP) .................. 2012-080684

(51) Int. Cl.
H01L 29/06 (2006.01)
H01L 21/265 (2006.01)
(Continued)

(52) U.S. Cl.
CPC ........ *H01L 29/0638* (2013.01); *H01L 21/263* (2013.01); *H01L 21/265* (2013.01);
(Continued)

(58) Field of Classification Search
CPC ................. H01L 21/263; H01L 21/265; H01L 21/26506; H01L 21/324; H01L 29/0638;
(Continued)

(56) References Cited

U.S. PATENT DOCUMENTS 4,752,818 A 6/1988 Kushida et al.
6,482,681 B1 11/2002 Francis et al.
(Continued)

FOREIGN PATENT DOCUMENTS

DE 102006046844 A1 4/2008
JP 2001-160559 A 6/2001
(Continued)

OTHER PUBLICATIONS

Japanese Office Action dated Jul. 28, 2015 and its partial English translation.
Extended European Search Report dated Jun. 25, 2015.

*Primary Examiner* — Allan R Wilson
(74) *Attorney, Agent, or Firm* — Rabin & Berdo, P.C.

(57) ABSTRACT

A $p^+$ collector layer is provided in a rear surface of a semiconductor substrate which will be an $n^-$ drift layer and an $n^+$ field stop layer is provided in a region which is deeper than the $p^+$ collector layer formed on the rear surface side. A front surface element structure is formed on the front surface of the semiconductor substrate and then protons are radiated to the rear surface of the semiconductor substrate at an acceleration voltage corresponding to the depth at which the $n^+$ field stop layer is formed. A first annealing process is performed at an annealing temperature corresponding to the proton irradiation to change the protons into donors, thereby forming a field stop layer. Then, annealing is performed using annealing conditions suitable for the conditions of a plurality of proton irradiation processes to recover each crystal defect formed by each proton irradiation process.

17 Claims, 21 Drawing Sheets

(51) Int. Cl.
    *H01L 29/66*     (2006.01)
    *H01L 29/739*     (2006.01)
    *H01L 29/15*     (2006.01)
    *H01L 21/324*     (2006.01)
    *H01L 29/10*     (2006.01)
    *H01L 21/263*     (2006.01)
    *H01L 29/861*     (2006.01)

(52) U.S. Cl.
CPC ...... *H01L 21/26506* (2013.01); *H01L 21/324* (2013.01); *H01L 29/1095* (2013.01); *H01L 29/155* (2013.01); *H01L 29/6609* (2013.01); *H01L 29/66348* (2013.01); *H01L 29/7395* (2013.01); *H01L 29/7397* (2013.01); *H01L 29/861* (2013.01)

(58) Field of Classification Search
CPC ............... H01L 29/1095; H01L 29/155; H01L 29/6609; H01L 29/66348; H01L 29/7395; H01L 29/7397; H01L 29/861
See application file for complete search history.

(56) References Cited

U.S. PATENT DOCUMENTS

| | | |
|---|---|---|
| 6,610,572 B1 | 8/2003 | Takei et al. |
| 6,620,653 B2 | 9/2003 | Matsudai et al. |
| 7,514,750 B2* | 4/2009 | Mauder ............ H01L 21/263 |
| | | 257/362 |
| 7,649,244 B2 | 1/2010 | Niedernostheide et al. |
| 8,354,709 B2 | 1/2013 | Schulze et al. |
| 8,766,413 B2 | 7/2014 | Nemoto et al. |
| 9,082,812 B2 | 7/2015 | Onozawa et al. |
| 2002/0130331 A1 | 9/2002 | Nemoto et al. |
| 2002/0190281 A1 | 12/2002 | Francis et al. |
| 2005/0116249 A1 | 6/2005 | Mauder et al. |
| 2006/0081923 A1 | 4/2006 | Mauder et al. |
| 2006/0211179 A1 | 9/2006 | Siemieniec et al. |
| 2006/0286753 A1 | 12/2006 | Barthelmess et al. |
| 2007/0120170 A1* | 5/2007 | Niedernostheide . H01L 29/0878 |
| | | 257/302 |
| 2008/0128798 A1 | 6/2008 | Schulze et al. |
| 2009/0039419 A1 | 2/2009 | Zundel et al. |
| 2009/0184340 A1 | 7/2009 | Nemoto et al. |
| 2010/0015818 A1 | 1/2010 | Barthelmess et al. |
| 2010/0052011 A1 | 3/2010 | Harada |
| 2010/0244093 A1 | 9/2010 | Rahimo et al. |
| 2012/0064706 A1 | 3/2012 | Nemoto et al. |
| 2012/0267681 A1 | 10/2012 | Nemoto et al. |
| 2014/0246750 A1 | 9/2014 | Takishita et al. |
| 2014/0291723 A1 | 10/2014 | Miyazaki et al. |
| 2015/0024556 A1 | 1/2015 | Miyazaki et al. |
| 2015/0050798 A1 | 2/2015 | Kobayashi et al. |
| 2015/0179441 A1 | 6/2015 | Onozawa |
| 2015/0311279 A1* | 10/2015 | Onozawa .......... H01L 29/66333 |
| | | 257/139 |

FOREIGN PATENT DOCUMENTS

| | | |
|---|---|---|
| JP | 2003-152198 A | 5/2003 |
| JP | 2003-533047 A | 11/2003 |
| JP | 2004-079878 A | 3/2004 |
| JP | 2006-344977 A | 12/2006 |
| JP | 2007-266233 A | 10/2007 |
| JP | 2008-227414 A | 9/2008 |
| JP | 2009-176892 A | 8/2009 |
| JP | 2010-541266 A | 12/2010 |
| JP | 2012-023327 A | 2/2012 |
| WO | WO-01-86712 A1 | 11/2001 |
| WO | WO-2011/052787 A1 | 5/2011 |

\* cited by examiner

FIG. 19

| RATED VOLTAGE (V) | BREAKDOWN VOLTAGE (V) | TOTAL THICKNESS OF SUBSTRATE $W_0$ (μm) | SPECIFIC RESISTANCE (Ωcm) | AVERAGE CONCENTRATION OF DRIFT LAYER (/cm³) | RATED CURRENT DENSITY (A/cm²) | DISTANCE INDEX L (μm) | FS LAYER WHICH DEPLETION LAYER END REACHES FIRST : DISTANCE FROM REAR SURFACE X (μm) | | | | | | | | | |
|---|---|---|---|---|---|---|---|---|---|---|---|---|---|---|---|---|
| | | | | | | | $W_0$−0.7L | $W_0$−0.8L | $W_0$−0.9L | $W_0$−1.0L | $W_0$−1.1L | $W_0$−1.2L | $W_0$−1.3L | $W_0$−1.4L | $W_0$−1.5L | $W_0$−1.6L |
| 600 | 700 | 80 | 30 | $1.5 \times 10^{14}$ | 300 | 31.9 | 37.7 | 34.5 | 31.3 | 28.1 | 24.9 | 21.7 | 18.5 | 15.3 | 12.1 | 8.9 |
| 1200 | 1400 | 120 | 60 | $7.7 \times 10^{13}$ | 200 | 58.2 | 79.2 | 73.4 | 67.6 | 61.8 | 55.9 | 50.1 | 44.3 | 38.5 | 32.7 | 26.8 |
| 1700 | 1900 | 170 | 85 | $5.4 \times 10^{13}$ | 150 | 80.8 | 113.4 | 105.3 | 97.3 | 89.2 | 81.1 | 73.0 | 64.9 | 56.9 | 48.8 | 40.7 |
| 3300 | 3500 | 330 | 165 | $2.8 \times 10^{13}$ | 80 | 155.0 | 221.5 | 206.0 | 190.5 | 175.0 | 159.5 | 144.0 | 128.5 | 113.0 | 97.5 | 82.0 |
| 4500 | 4700 | 450 | 225 | $2.0 \times 10^{13}$ | 50 | 223.1 | 293.8 | 271.5 | 249.2 | 226.9 | 204.6 | 182.3 | 160.0 | 137.7 | 115.4 | 93.1 |
| 6500 | 6700 | 650 | 325 | $1.4 \times 10^{13}$ | 30 | 337.3 | 413.9 | 380.1 | 346.4 | 312.7 | 278.9 | 245.2 | 211.5 | 177.7 | 144.0 | 110.3 |

(A)　　　(B)

(A)　　　(B)

MANUFACTURING METHOD FOR SEMICONDUCTOR DEVICE

CROSS-REFERENCE TO RELATED APPLICATIONS

This application is a divisional of U.S. application Ser. No. 14/372,453, filed on Jul. 16, 2014, which is, in turn, a national stage of PCT application number PCT/JP2013/059775, filed Mar. 29, 2013. Further, this application claims the benefit of priority of Japanese application serial number 2012-080684, filed on Mar. 30, 2012. The disclosures of these prior US and Japanese applications are incorporated herein by reference.

TECHNICAL FIELD

The present invention relates to a method for manufacturing a semiconductor device.

BACKGROUND ART

As a power semiconductor device, for example, there is an insulated gate bipolar transistor (IGBT) or a diode with various classes of a breakdown voltage, for example, a breakdown voltage of 400 V, 600 V, 1200 V, 1700 V, 3300 V, or more. The power semiconductor device is used in a power conversion device, such as a converter or an inverter.

The following method has been known as a method for manufacturing the power semiconductor device. First, a front surface element structure is formed on a front surface of a semiconductor substrate. Then, a rear surface of the semiconductor substrate is removed by, for example, grinding to reduce the thickness of the semiconductor substrate. Then, impurity ions are implanted into the ground rear surface of the semiconductor substrate. Then, a heat treatment is performed to activate the impurity ions implanted into the rear surface of the semiconductor substrate to form a rear surface element structure. In addition, as this type of method, various methods have been proposed which radiate protons to the semiconductor substrate and perform a heat treatment to activate the protons (to change the protons into donors), thereby forming an $n^+$ layer with a high concentration in the semiconductor substrate.

As the method for manufacturing the semiconductor device, a technique has been known which radiates protons to a semiconductor substrate to reduce electron/hole mobility at a proton irradiation position (for example, see the following Patent Document 1). In addition, heat treatment conditions after protons are radiated to a semiconductor substrate have been known (for example, see the following Patent Document 2). After protons are radiated, annealing is performed at a predetermined temperature to recover a crystal defect layer. As a result, the carrier concentration is recovered. In addition, a method has been known in which a plurality of proton irradiation processes are performed to form a plurality of $n^+$ layers including hydrogen donors and the depth of an $n^+$ layer, which is formed at the deepest position from the rear surface of a substrate, from the rear surface of the substrate is 15 μm (for example, see the following Patent Document 3).

CITATION LIST

Patent Document

Patent Document 1: US 2005/0,116,249 A
Patent Document 2: US 2006/0,286,753 A
Patent Document 3: US 2006/0,081,923 A However, in the technique disclosed in Patent Document 1, the electron/hole mobility can be reduced by the residual defect which is introduced by proton irradiation, that is, disorder. However, since the crystal defect layer is provided in the vicinity of the rear surface of the semiconductor substrate, electrical characteristics deteriorate, for example, a leakage current increases.

In the technique disclosed in Patent Document 2, the crystal defect which occurs during proton irradiation is recovered by predetermined heat treatment conditions. However, in the proton irradiation, there are two irradiation conditions, that is, a difference in dose and a difference in acceleration voltage. In the technique disclosed in Patent Document 2, it is difficult to perform an annealing process in which two irradiation conditions of the proton irradiation are both optimized. That is, under the condition that the temperature of the annealing process is low or the annealing time is short, the crystal defect layer (disorder) remains. In contrast, when the temperature of the annealing process is too high or the annealing time is too long, the carrier concentration of protons is reduced.

When the average range (the distance of a position where the concentration of radiated ions is the highest from an irradiation surface) of proton irradiation (implantation) is greater than 15 μm as in the technique disclosed in Patent Document 3, a reduction in disorder is insufficient in the vicinity of the irradiation surface (rear surface) and in a proton passage region. FIG. 15 is a characteristic diagram illustrating the relation between the average range of proton irradiation and carrier concentration in the related art. FIG. 15 shows a carrier concentration distribution for each average range when the average range Rp of proton irradiation is about 15 μm and is greater than 15 μm and an annealing process is performed at the same temperature. FIG. 15(A) shows a case in which the average range Rp of proton irradiation is 50 μm, FIG. 15(B) shows a case in which the average range Rp of proton irradiation is 20 μm, and FIG. 15(C) shows a case in which the average range Rp of proton irradiation is 15 μm.

When the average range Rp of proton irradiation is 15 μm as shown in FIG. 15(C), the carrier concentration in the vicinity of the irradiation surface (a depth of 0 μm to 5 μm) and the proton passage region is higher than $1 \times 10^{14}$ (/cm$^3$) which is the concentration of a silicon substrate and disorder is not sufficiently reduced. In contrast, when the average range Rp of proton irradiation is 20 μm as shown in FIG. 15(B) and when the average range Rp of proton irradiation is 50 μm as shown in FIG. 15(A), the carrier concentration in the vicinity of the irradiation surface and the proton passage region is greatly reduced and disorder is not reduced. As such, when disorder remains, the leakage current or conduction loss of the element increases. When the average range Rp of proton irradiation is greater than 15 μm, carrier mobility is significantly reduced due to the residual disorder.

In particular, when a plurality of proton irradiation processes are performed to form a plurality of $n^+$ layers with a high concentration at different depth positions in the semiconductor substrate while changing the depth of the semiconductor substrate, the proton irradiation is performed under different conditions. However, when an annealing process is collectively performed only under one condition, the above-mentioned problems arise.

When the annealing process is collectively performed after a plurality of proton irradiation processes are performed, the following problems arise depending on which of a plurality of n+ layers is annealed at the optimal annealing temperature. For this problem, the following case will be described as an example: among three proton irradiation processes, the first proton irradiation process is performed to form the n+ layer at the deepest position from the irradiation surface and the second and third proton irradiation processes are sequentially performed to form the n+ layers at the second and third deepest positions from the irradiation surface.

The n+ layer formed by the first proton irradiation process is deeper than the n+ layers formed by the second and third proton irradiation processes from the irradiation surface. The acceleration energy of protons in the first proton irradiation process among the first to third proton irradiation processes is the highest. Therefore, the crystalline damage of the semiconductor substrate which is given to the proton passage region from the irradiation surface to the average range Rp of the proton in the first proton irradiation process is the largest among the three proton irradiation processes. There is a method which increases the annealing temperature in order to reduce the damage of the first proton irradiation process. However, in this case, the damage is reduced, but the carrier concentration of the n+ layer by proton irradiation is reduced.

In addition to the above-mentioned problems, the following problem arises. For example, when the annealing temperature is reduced in order to increase the carrier concentration of the n+ layer which is formed closest to (shallowest from) the irradiation surface by the third proton irradiation process, the damage applied to the substrate by the first proton irradiation process which is performed at the deepest position from the rear surface of the substrate is not sufficiently reduced. Therefore, a large amount of disorder remains in the proton passage region formed by the first proton irradiation process and the electrical characteristics of the element are likely to deteriorate.

As described above, in many cases, the annealing temperatures required to form a plurality of n+ layers are different. Therefore, when the annealing process is collectively performed after a plurality of proton irradiation processes, it is difficult to maintain the carrier concentration of the n+ layer by proton irradiation at a high level while sufficiently reducing the disorder of the proton passage region.

The invention has been made in order to solve the above-mentioned problems of the related art and an object of the invention is to provide a semiconductor device manufacturing method which can perform an annealing process using annealing conditions suitable for the conditions of a plurality of proton irradiation processes to recover each crystal defect formed by each proton irradiation process, thereby forming a plurality of regions with high carrier concentration. In addition, an object of the invention is to provide a semiconductor device manufacturing method which can improve poor electrical characteristics, such as an increase in leakage current.

SUMMARY

In order to solve the above-mentioned problems and achieve the objects of the invention, a method for manufacturing a semiconductor device according to the invention has the following characteristics. First, an irradiation step of radiating a proton to a rear surface of a semiconductor substrate of a first conductivity type is performed. Then, an annealing step of activating the proton radiated to the rear surface of the semiconductor substrate to form a first semiconductor layer of the first conductivity type which has a higher impurity concentration than the semiconductor substrate is performed. A set of the irradiation step and the annealing step is performed a plurality of times according to irradiation conditions of the irradiation step to form a plurality of the first semiconductor layers in a depth direction of the semiconductor substrate.

In the method for manufacturing a semiconductor device according to the invention, in the irradiation step, as a depth of a region, in which the first semiconductor layer is formed, from the rear surface of the semiconductor substrate increases, an acceleration voltage may increase. In the annealing step, as the depth of the region, in which the first semiconductor layer is formed, from the rear surface of the semiconductor substrate increases, an annealing temperature may increase. The sets of the irradiation step and the annealing step may be sequentially performed, starting from the set of the irradiation step and the annealing step by which the first semiconductor layer is formed at the deepest position from the rear surface of the semiconductor substrate.

In the method for manufacturing a semiconductor device according to the invention, in the set of the irradiation step and the annealing step, one annealing step may be performed after a plurality of irradiation steps.

In the method for manufacturing a semiconductor device according to the invention, the first semiconductor layer may be a field stop layer that suppresses the spreading of a depletion layer.

In the method for manufacturing a semiconductor device according to the invention, the number of first semiconductor layers formed by the irradiation step and the annealing step may be based on a thickness of the semiconductor substrate or a rated voltage, or both the thickness of the semiconductor substrate and the rated voltage.

In the method for manufacturing a semiconductor device according to the invention, the semiconductor device may be an insulated gate bipolar transistor.

In the method for manufacturing a semiconductor device according to the invention, the semiconductor device may be a diode.

The method for manufacturing a semiconductor device according to the invention has the following characteristics. A drift layer of the first conductivity type which is the semiconductor substrate may be provided. A second semiconductor layer of a second conductivity type may be formed on a front surface of the semiconductor substrate. When q is an elementary charge, $N_d$ is an average concentration of the drift layer, $\varepsilon_s$ is the permittivity of the semiconductor substrate, $V_{rate}$ is a rated voltage, $J_F$ is rated current density, and $v_{sat}$ is a saturated speed at which a speed of carriers is saturated with predetermined electric field intensity, a distance index L may be represented by the following Expression (1). When the depth of a position where the carrier concentration of the first semiconductor layer closest to the second semiconductor layer is a peak concentration from the rear surface of the semiconductor substrate is X and the thickness of the semiconductor substrate is $W_0$, the position where the carrier concentration of the first semiconductor layer closest to the second semiconductor layer is the peak concentration may be set such that $X=W_0-\gamma L$ is established and $\gamma$ is equal to or greater than 0.2 and equal to or less than 1.5.

$$L = \sqrt{\frac{\varepsilon_S V_{rate}}{\left(\frac{J_F}{qv_{sat}} + N_d\right)}} \quad \text{[Expression (1)]}$$

In the method for manufacturing a semiconductor device according to the invention, γ may be equal to or greater than 0.9 and equal to or less than 1.4.

In the method for manufacturing a semiconductor device according to the invention, γ may be equal to or greater than 1.0 and equal to or less than 1.3.

In order to solve the above-mentioned problems and achieve the objects of the invention, a method for manufacturing a semiconductor device according to the invention has the following characteristics. First, an irradiation step of radiating a proton to a rear surface of a semiconductor substrate of a first conductivity type is performed. Then, an annealing step of activating the proton radiated to the rear surface of the semiconductor substrate to form a first semiconductor layer of the first conductivity type which has a higher impurity concentration than the semiconductor substrate is performed. A set of the irradiation step and the annealing step is performed a plurality of times to form a plurality of the first semiconductor layers in a depth direction of the semiconductor substrate. In this case, in a first annealing step among the plurality of annealing steps, which forms a set together with a first irradiation step of radiating the proton to the deepest position from the rear surface of the semiconductor substrate among the plurality of irradiation steps, an annealing temperature is equal to or higher than 380° C. and equal to or lower than 450° C. In a second annealing step among the plurality of annealing steps, which forms a set together with a second irradiation step of radiating the proton to the second deepest position from the rear surface of the semiconductor substrate among the plurality of irradiation steps, the annealing temperature is equal to or higher than 350° C. and equal to or lower than 420° C. In a third annealing step among the plurality of annealing steps, which forms a set together with a third irradiation step of radiating the proton to the third deepest position from the rear surface of the semiconductor substrate among the plurality of irradiation steps, the annealing temperature is equal to or higher than 340° C. and equal to or lower than 400° C.

In the method for manufacturing a semiconductor device according to the invention, in the first annealing step, the annealing temperature may be equal to or higher than 400° C. and equal to or lower than 420° C. In the second annealing step, the annealing temperature may be equal to or higher than 370° C. and equal to or lower than 390° C. In the third annealing step, the annealing temperature may be equal to or higher than 350° C. and equal to or lower than 370° C.

In order to solve the above-mentioned problems and achieve the objects of the invention, a method for manufacturing a semiconductor device according to the invention has the following characteristics. An irradiation step of radiating a proton to a rear surface of a semiconductor substrate of a first conductivity type is performed. Then, an annealing step of activating the proton radiated to the rear surface of the semiconductor substrate to form a first semiconductor layer of the first conductivity type which has a higher impurity concentration than the semiconductor substrate is performed. In this case, a set of one or more irradiation steps and one annealing step is performed a plurality of times according to irradiation conditions of the irradiation step to form a plurality of the first semiconductor layers in a depth direction of the semiconductor substrate.

In the method for manufacturing a semiconductor device according to the invention, in the irradiation step, acceleration energy E of the proton when the first semiconductor layer with a range Rp is formed by the radiation of the proton may satisfy the following Expression (2) in which x is a logarithm log(Rp) of the range Rp and y is a logarithm log(E) of the acceleration energy E.

$$y = -0.0047x^4 + 0.0528x^3 - 0.2211x^2 + 0.9923x + 5.0474 \quad \text{[Expression (2)]}$$

According to the invention, proton irradiation and annealing form a set and the conditions of the proton irradiation and the annealing are defined depending on the position of the first semiconductor layer to be formed on the semiconductor substrate. Therefore, it is possible to increase the impurity concentration of each of a plurality of first semiconductor layers. The annealing is performed using annealing conditions suitable for the conditions of a plurality of proton irradiation processes. Therefore, it is possible to recover each crystal defect formed by each proton irradiation process and to increase the carrier concentration. In addition, it is possible to improve poor electrical characteristics, such as an increase in leakage current.

According to the method for manufacturing a semiconductor device of the invention, annealing is performed using annealing conditions suitable for the conditions of a plurality of proton irradiation processes. Therefore, it is possible to recover each crystal defect formed by each proton irradiation process and to form a plurality of regions with a high carrier concentration. In addition, it is possible to improve poor electrical characteristics, such as an increase in leakage current.

BRIEF DESCRIPTION OF THE DRAWINGS

FIG. 19 is a diagram illustrating the position conditions of a field stop layer which a depletion layer reaches first in the semiconductor device according to the invention;

DETAILED DESCRIPTION

Figure 1:
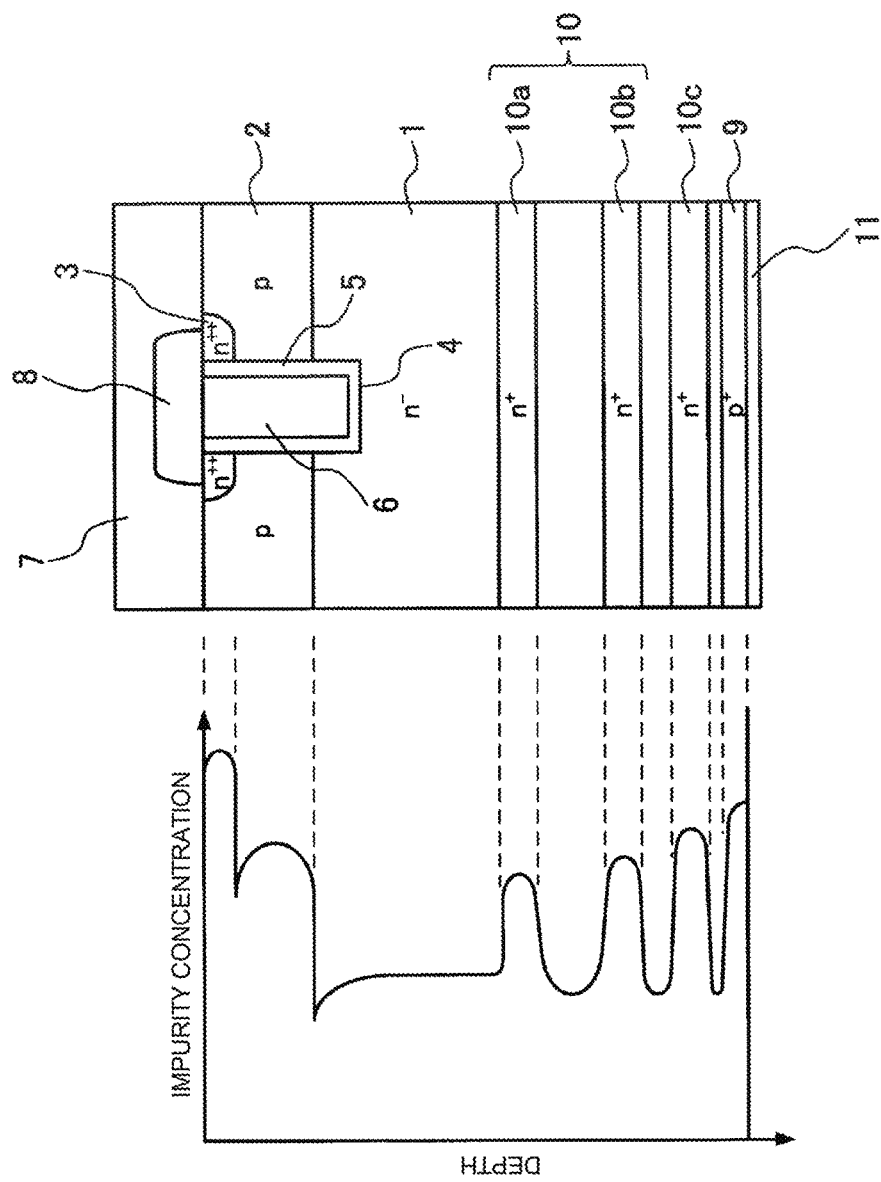
FIG. 1 is a cross-sectional view illustrating an example of a semiconductor device manufactured by a semiconductor device manufacturing method according to Embodiment 1.

Hereinafter, preferred embodiments of a method for manufacturing a semiconductor device according to the invention will be described in detail with reference to the accompanying drawings. In the specification and the accompanying drawings, in the layers or regions having "n" or "p" appended thereto, an electron or a hole means a majority carrier. In addition, symbols "+" and "−" added to n or p mean that impurity concentration is higher and lower than that of the layer without the symbols. In the description of the following embodiments and the accompanying drawings, the same components are denoted by the same reference numerals and the description thereof will not be repeated.

(Embodiment 1)

First, the structure of a trench gate IGBT, which is an example of a semiconductor device produced (manufactured) by a semiconductor device manufacturing method according to Embodiment 1, will be described. FIG. 1 is a cross-sectional view illustrating an example of the semiconductor device manufactured by the semiconductor device manufacturing method according to Embodiment 1. An impurity concentration distribution in a depth direction of a semiconductor substrate from the boundary between an emitter electrode 7 and an $n^{++}$ emitter region 3 is shown on the left side of FIG. 1. In the semiconductor device manufactured by the semiconductor device manufacturing method according to Embodiment 1 shown in FIG. 1, a p base region 2 is provided in a surface layer of a front surface of the semiconductor substrate which will be an $n^-$ drift layer 1.

The $n^{++}$ emitter region 3 is provided in the p base region 2 so as to be exposed from the front surface of the semiconductor substrate. The impurity concentration of the $n^{++}$ emitter region 3 is higher than the impurity concentration of the $n^-$ drift layer 1. A trench 4 is provided so as to reach the $n^-$ drift layer 1 through the $n^{++}$ emitter region 3 and the p base region 2. A gate insulating film 5 is provided along the side wall and bottom of the trench 4. In the trench 4, a gate electrode 6 is provided inside the gate insulating film 5 so as to be buried in the trench 4.

The emitter electrode 7 comes into contact with the p base region 2 and the $n^{++}$ emitter region 3. In addition, the emitter electrode 7 is electrically insulated from the gate electrode 6 by an interlayer insulating film 8. A $p^+$ collector layer 9 is provided in a surface layer of the rear surface of the semiconductor substrate which will be the $n^-$ drift layer 1 and an $n^+$ field stop (FS) layer 10 serving as a first semiconductor layer is provided in a region which is deeper than the $p^+$ collector layer 9 from the rear surface. The $n^+$ field stop layer 10 includes a plurality of $n^+$ layers 10a to 10c which are formed at different positions in the depth direction of the semiconductor substrate. A collector electrode 11 comes into contact with the $p^+$ collector layer 9. The impurity concentration of the $p^+$ collector layer 9 is high enough to obtain ohmic contact with the collector electrode 11.

Each of the $n^+$ layers 10a to 10c of the $n^+$ field stop layer 10 extends in a direction perpendicular to the depth direction of the semiconductor substrate so as to be substantially parallel to the $p^+$ collector layer 9. Each of the $n^+$ layers 10a to 10c is formed with a uniform thickness. The $n^+$ layer 10c which is closest to the rear surface of the semiconductor substrate may be separated from the $p^+$ collector layer 9 or it may come into contact with the $p^+$ collector layer 9. The impurity concentration of the $n^+$ field stop layer 10 is higher than the impurity concentration of the $n^-$ drift layer 1. The $n^+$ field stop layer 10 is a semiconductor layer formed by hydrogen induced donors. The hydrogen induced donor means a donor which is induced from a composite lattice defect of a hydrogen atom which is introduced in the depth direction of the semiconductor substrate by proton irradiation and a vacancy or a divacancy around the hydrogen atom.

Figure 2:
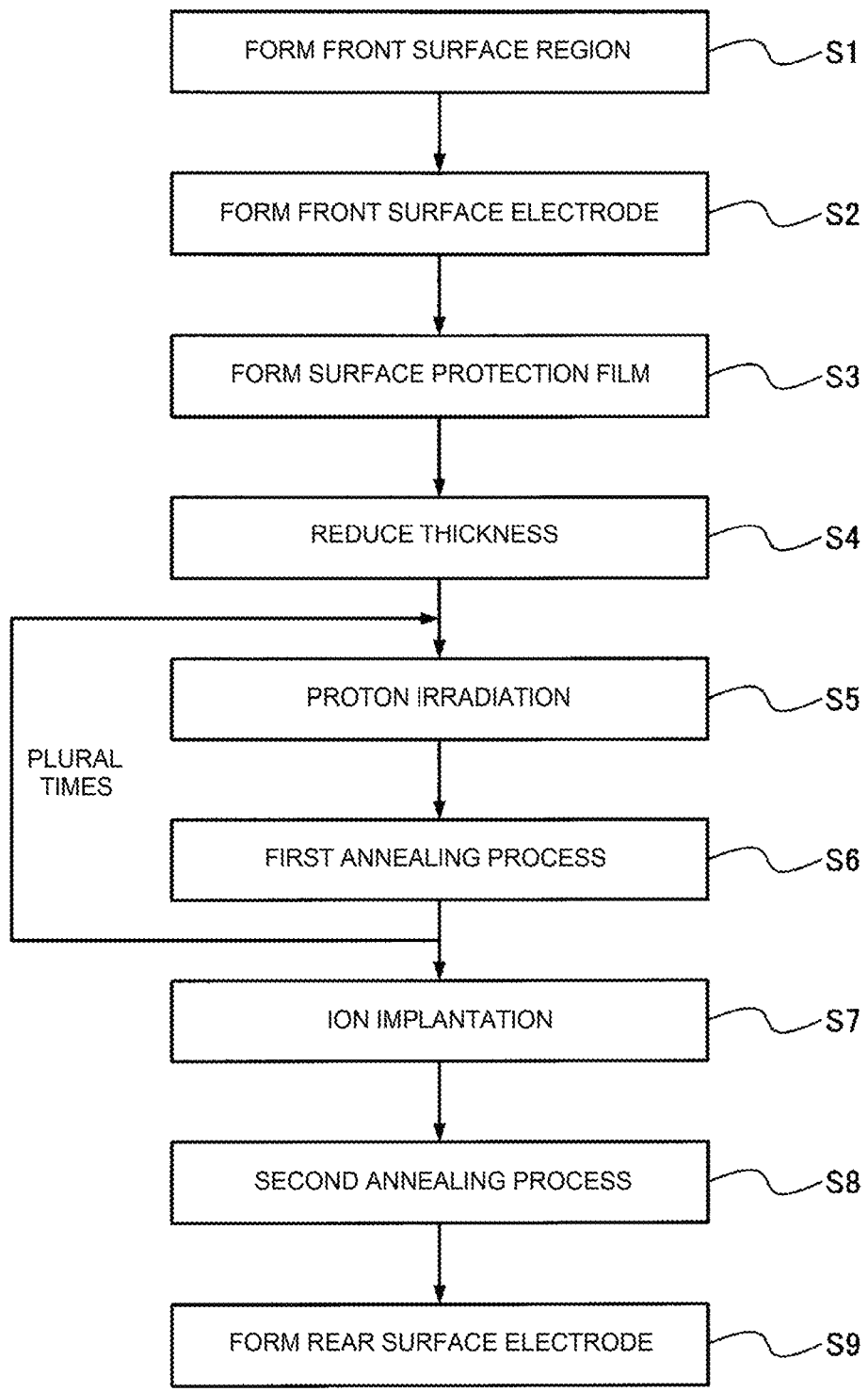
FIG. 2 is a flowchart illustrating the outline of the semiconductor device manufacturing method according to Embodiment 1.

Next, the outline of the semiconductor device manufacturing method according to Embodiment 1 will be described. FIG. 2 is a flowchart illustrating the outline of the semiconductor device manufacturing method according to Embodiment 1. As shown in FIG. 2, in the semiconductor device manufacturing method according to Embodiment 1, first, each semiconductor region which is a contact of a front surface electrode is formed in the front surface of the semiconductor substrate (Step S1). Then, the front surface electrode is formed on the front surface of the semiconductor substrate (Step S2). Then, a surface protection film is formed on the front surface of the semiconductor substrate (Step S3). Then, the rear surface of the semiconductor substrate is removed by, for example, grinding or etching so that the thickness of the semiconductor substrate is uniformly reduced (the semiconductor substrate is thinned) (Step S4).

Then, proton irradiation for forming the $n^+$ field stop layer is performed for the rear surface of the semiconductor substrate (Step S5). The proton irradiation is performed in Step S5 with irradiation energy which enables a proton to be radiated to a position deeper than a semiconductor layer which will be a contact with a rear surface electrode. Then, the proton which is radiated in Step S5 is activated (changed into a donor) by a first annealing process (Step S6). Here, the term "activation" means reducing a large number of crystal defects (the disorder of a crystal) introduced into the semiconductor substrate by proton irradiation, in addition to forming the hydrogen induced donor. The residual disorder causes an increase in leakage current or on-voltage (a voltage drop during electrical conduction). The n+ field stop layer is formed in a deep region of the semiconductor substrate which is close to the rear surface by Steps S5 and S6. The first annealing process in Step S6 is preferably performed at a temperature which does not reduce or vanish the hydrogen induced donors formed by proton irradiation.

Then, as shown in FIG. 1, when a plurality of n+ layers 10a to 10c are formed in the depth direction of the semiconductor substrate, the n+ layer 10a, the n+ layer 10b, and the n+ layer 10c are formed in this order from the side close to the p base region 2 which is deepest from the rear surface of the semiconductor substrate to the rear surface of the semiconductor substrate since proton irradiation is performed from the rear surface of the semiconductor substrate.

In this case, the proton irradiation in Step S5 and the first annealing process in Step S6 form a set and the number of times Steps S5 and S6 are repeated is equal to the number of n+ layers to be provided. As the depth of the n+ layers 10a to 10c increases, the acceleration voltage of the proton irradiation in Step S5 and the annealing temperature in Step S6 increase, which will be described in detail below. As the annealing temperature increases, the rate of change into a donor tends to be reduced. Therefore, first, the n+ layer 10a is formed at a deep position, as viewed from the depth direction from the rear surface of the semiconductor substrate. Then, the n+ layer 10b is formed at a position close to the rear side of the semiconductor substrate and then the n+ layer 10c is formed at a position closest to the rear surface. Adjacent n+ layers may come into contact with each other or they may be separated from each other.

The rate of change into a donor means the percentage of the integrated concentration, which is obtained by integrating the doping concentration of the n+ layer in the depth direction in the width range of the n+ layer, with respect to the dose of the proton radiated (implanted) in one n+ layer. For example, when the proton dose is $1 \times 10^{14}/cm^2$ and the integrated concentration of one n+ layer is $1 \times 10^{13}/cm^2$, the rate of change into a donor is 10%. The width of the n+ layer may be considered as the distance between two points when extrapolation is performed until the doping concentration of the n+ layer is reduced from a peak concentration to the front surface and the rear surface and is equal to the doping concentration of the semiconductor substrate.

Then, impurity ions for forming a semiconductor layer, which will be a contact with the rear surface electrode, are implanted into the rear surface of the thinned semiconductor substrate (Step S7). In Step S7, the ion implantation is performed with a sufficiently high dose to obtain ohmic contact with the rear surface electrode which will be formed in the next step. Then, a second annealing process is performed to activate the impurity ions implanted in Step S7 (Step S8). The semiconductor layer (for example, a collector layer) which is a contact with the rear surface electrode is formed in the surface layer of the rear surface of the semiconductor substrate by Step S8.

Then, the rear surface electrode is formed on the rear surface of the semiconductor substrate by, for example, a physical vapor deposition method, such as a sputtering method (Step S9). In this way, the semiconductor device according to Embodiment 1 is completed.

Figure 3:
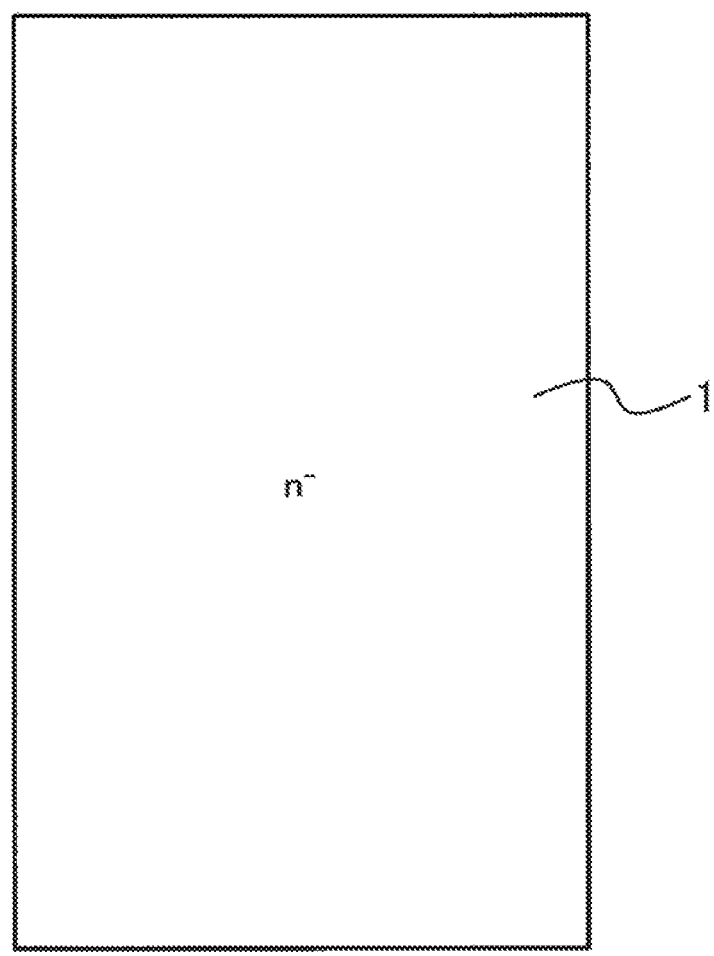
FIG. 3 is a cross-sectional view illustrating the semiconductor device according to Embodiment 1 which is being manufactured.
Figure 4:
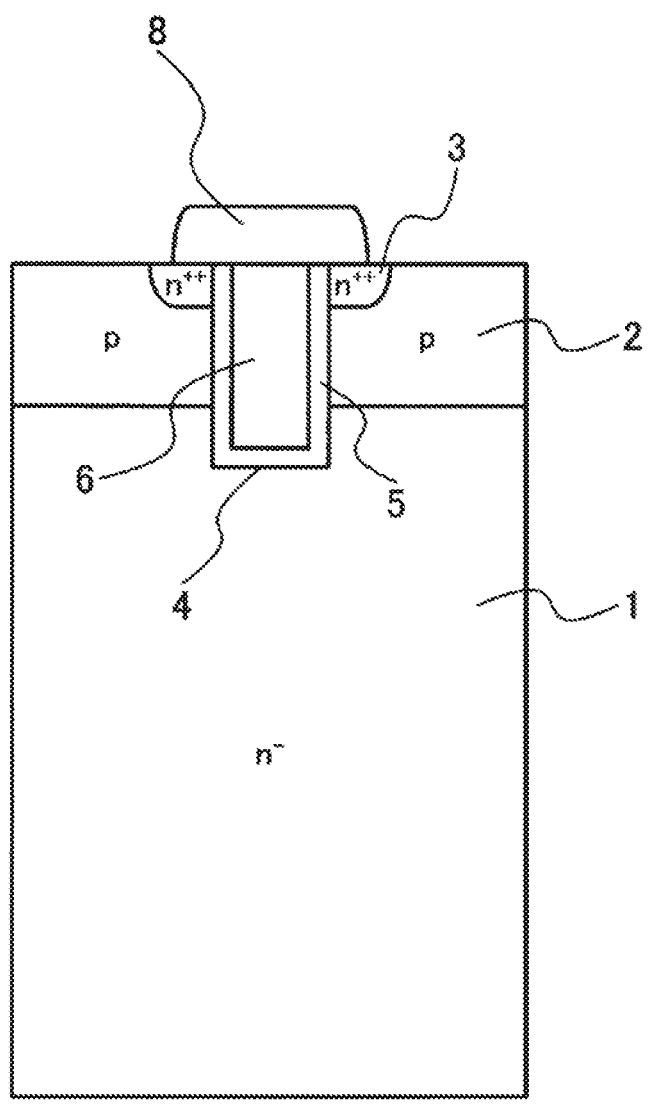
FIG. 4 is a cross-sectional view illustrating the semiconductor device according to Embodiment 1 which is being manufactured.

Next, a method of manufacturing the trench gate IGBT shown in FIG. 1 will be described in detail as an example of the semiconductor device manufacturing method according to Embodiment 1. FIGS. 3 to 12 are cross-sectional views illustrating the semiconductor device according to Embodiment 1 which is being manufactured. First, as shown in FIG. 3, the semiconductor substrate which will be the n− drift layer 1 is prepared. Then, as shown in FIG. 4, a trench gate MOS (metal-oxide film-semiconductor insulated gate) structure including the p base region 2, the n++ emitter region 3, the trench 4, the gate insulating film 5, and the gate electrode 6 is formed on the front surface of the semiconductor substrate by a general method.

Figure 5:
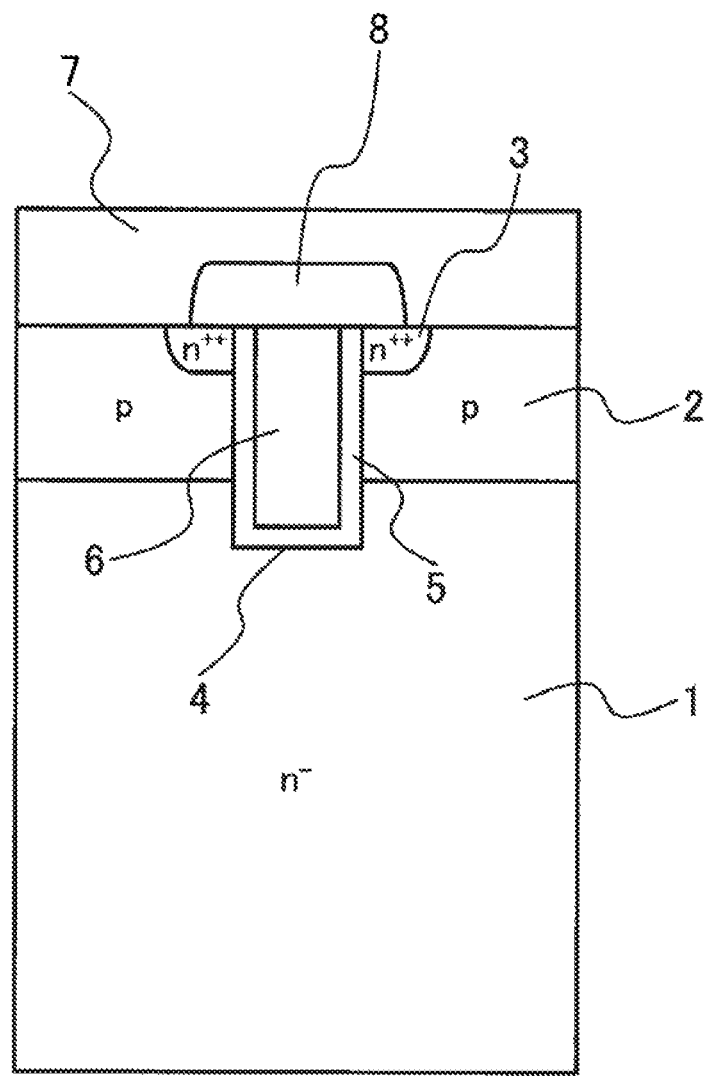
FIG. 5 is a cross-sectional view illustrating the semiconductor device according to Embodiment 1 which is being manufactured.

Then, as shown in FIG. 5, an aluminum silicon (AlSi) film which will be the emitter electrode 7 is deposited on the front surface of the semiconductor substrate by sputtering. Then, the aluminum silicon film is patterned to form a wiring pattern and annealing is performed. In this way, the emitter electrode 7 is formed on the front surface of the semiconductor substrate. Then, for example, a polyimide film which will be a surface protection film (not shown) is applied onto the front surface of the semiconductor substrate so as to cover the emitter electrode 7. Then, the polyimide film is patterned to expose a portion of the emitter electrode 7 and the polyimide film is cured (burned). Then, the rear surface of the semiconductor substrate is, for example, ground to reduce the thickness of the semiconductor substrate and the semiconductor substrate is cleaned to remove adhesive materials.

Figure 6:
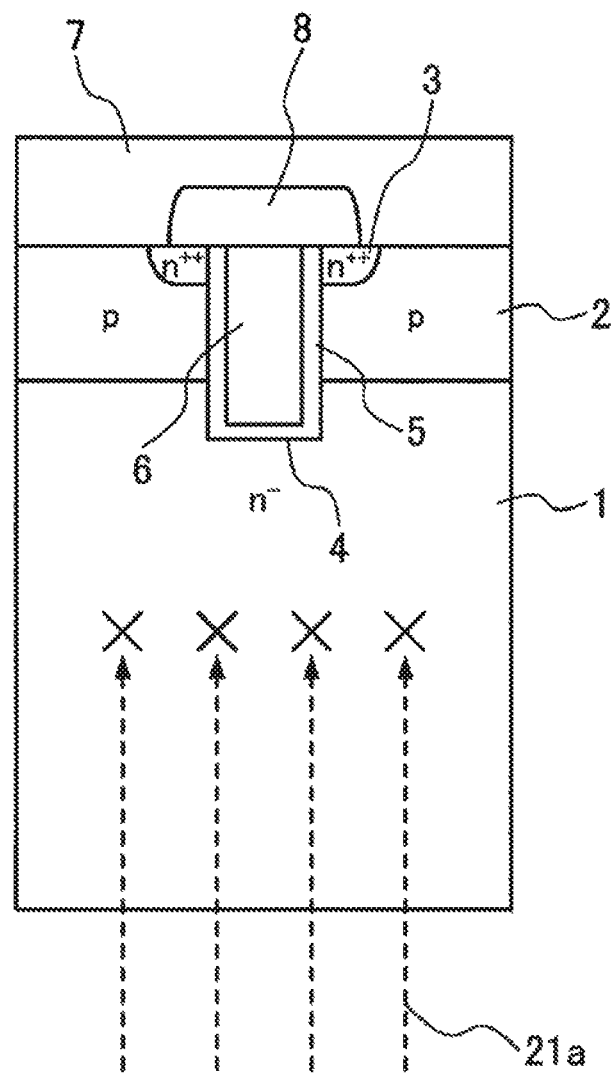
FIG. 6 is a cross-sectional view illustrating the semiconductor device according to Embodiment 1 which is being manufactured.

Then, the plurality of n+ layers 10a to 10c are formed in the depth direction of the n− drift layer 1 of the semiconductor substrate. First, the first n+ layer 10a is formed. As shown in FIG. 6, a proton 21a is radiated to the deepest region which is a predetermined distance away from the rear surface of the semiconductor substrate. At that time, proton irradiation is performed at the highest acceleration voltage depending on the depth from the rear surface of the semiconductor substrate. For example, the acceleration voltage may be determined as follows: when the depth of the n+ layer from the rear surface is about 100 µm, the acceleration voltage is 3 MeV; when the depth is about 50 µm, the acceleration voltage is 2 MeV; and when the depth is about 20 µm or less, the acceleration voltage is equal to or less than 1 MeV.

For example, when the depth of the n+ layer 10a from the rear surface of the substrate is 60 µm, the corresponding acceleration energy of the proton is 2.31 MeV. The depth of the n+ layer 10a from the rear surface of the substrate also depends on the rated voltage of the element and is typically in the range of 20 µm to 100 µm. The range of the acceleration energy of the proton corresponding to the depth range is, for example, from 1.17 MeV to 3.13 MeV. The proton dose may be determined on the basis of, for example, the peak concentration of the n+ layer to be formed. For example, the proton dose may be equal to or greater than $1 \times 10^{11}/cm^2$ and equal to or less than $1 \times 10^{15}/cm^2$.

Figure 7:
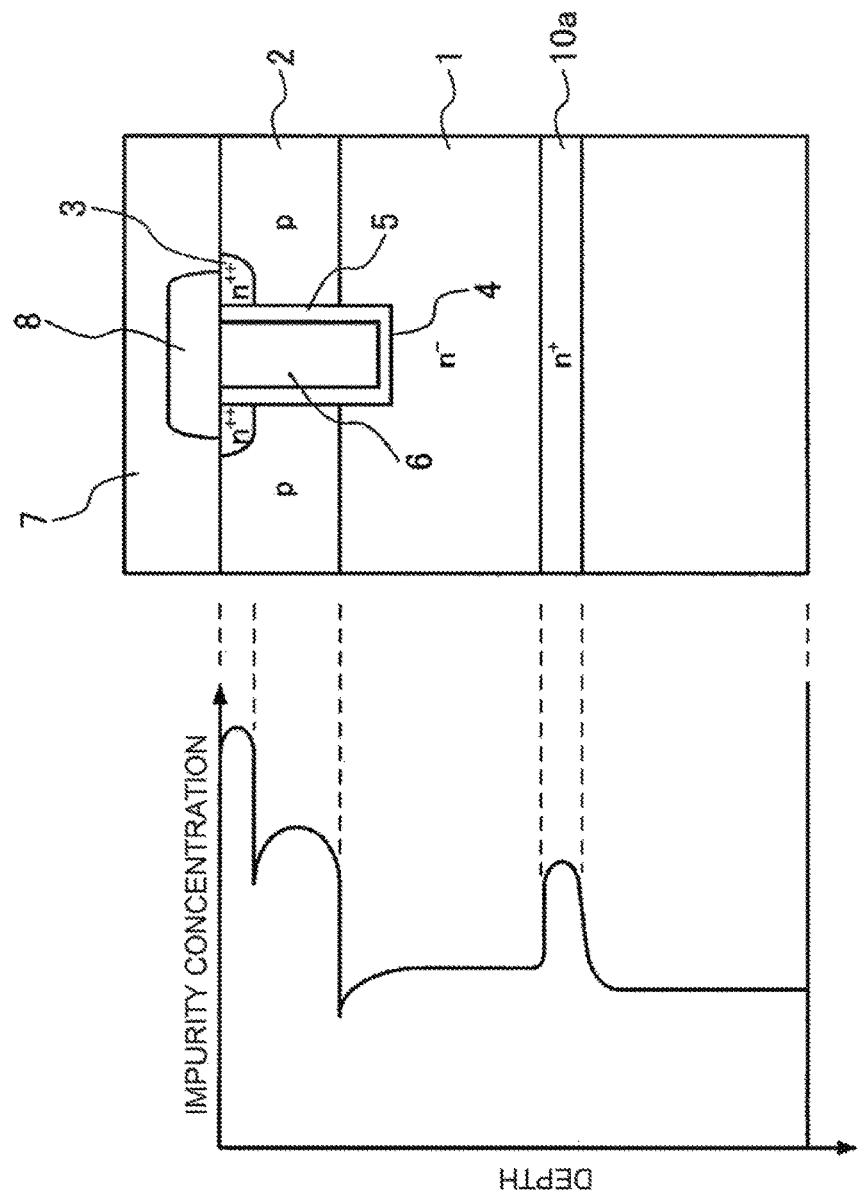
FIG. 7 is a cross-sectional view illustrating the semiconductor device according to Embodiment 1 which is being manufactured.

Then, as shown in FIG. 7, the radiated proton 21a is activated by the first annealing process and the n+ layer 10a is formed in a deep region that is a predetermined distance away from the rear surface of the semiconductor substrate. In the first annealing process, the n+ layer 10a is formed at the highest temperature among the temperatures at which the plurality of n+ layers 10a to 10c are formed, depending on the depth from the rear surface of the semiconductor substrate. For example, the n+ layer 10a is formed at a temperature of 400° C. In this way, as shown on the left side of FIG. 7, the first n+ layer 10a with a high impurity concentration is formed at a position that is closest to the p base region 2 which is formed on the front surface side of the semiconductor substrate. As such, the annealing temperature required for the n+ layer 10a which is deepest from the rear surface of the substrate is, for example, equal to or higher than 380° C. and equal to or lower than 450° C. and preferably, equal to or higher than 400° C. and equal to or less than 420° C.

Figure 8:
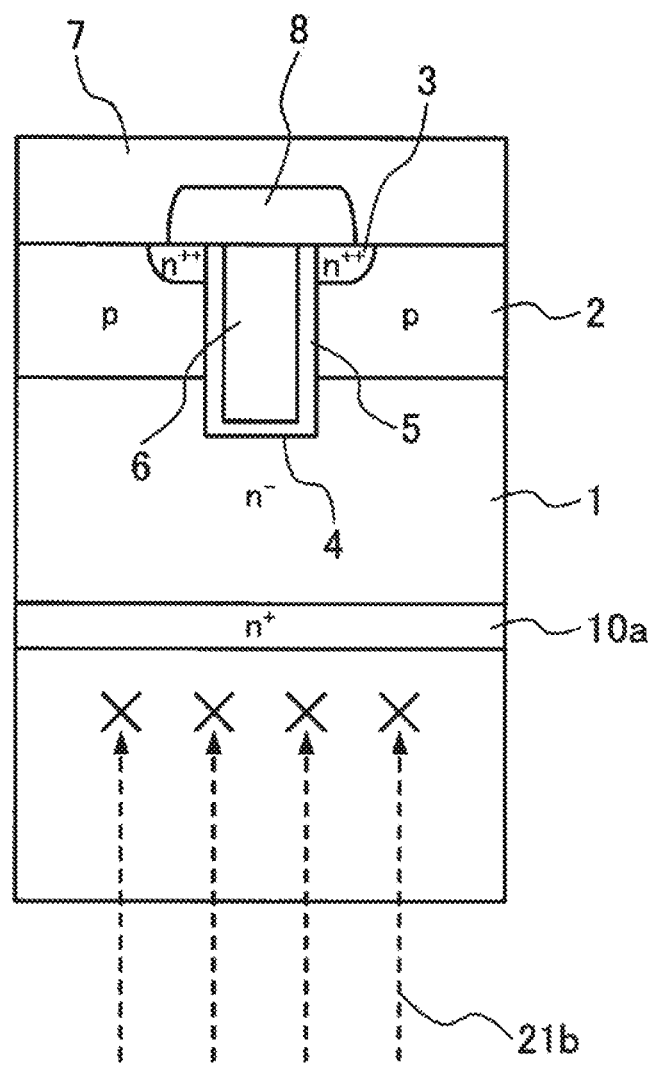
FIG. 8 is a cross-sectional view illustrating the semiconductor device according to Embodiment 1 which is being manufactured.

Then, the second n+ layer 10b is formed. Specifically, as shown in FIG. 8, a proton 21b is radiated to a region which is a predetermined distance away from the rear surface of the semiconductor substrate and is shallower than the n+ layer 10a. At that time, the acceleration voltage of the proton irradiation depends on the depth from the rear surface of the semiconductor substrate and is an intermediate value that is less than the acceleration voltage applied when the n+ layer 10a is formed. For example, when the depth of the n+ layer 10b from the rear surface of the substrate is 30 µm, the corresponding acceleration energy of the proton is 1.5 MeV. The depth of the n+ layer 10b from the rear surface of the substrate depends on the rated voltage of the element and is in the typical range of 10 µm to 50 µm. The range of the acceleration energy of the proton corresponding to the depth range is, for example, from 0.74 MeV to 2.07 MeV.

Figure 9:
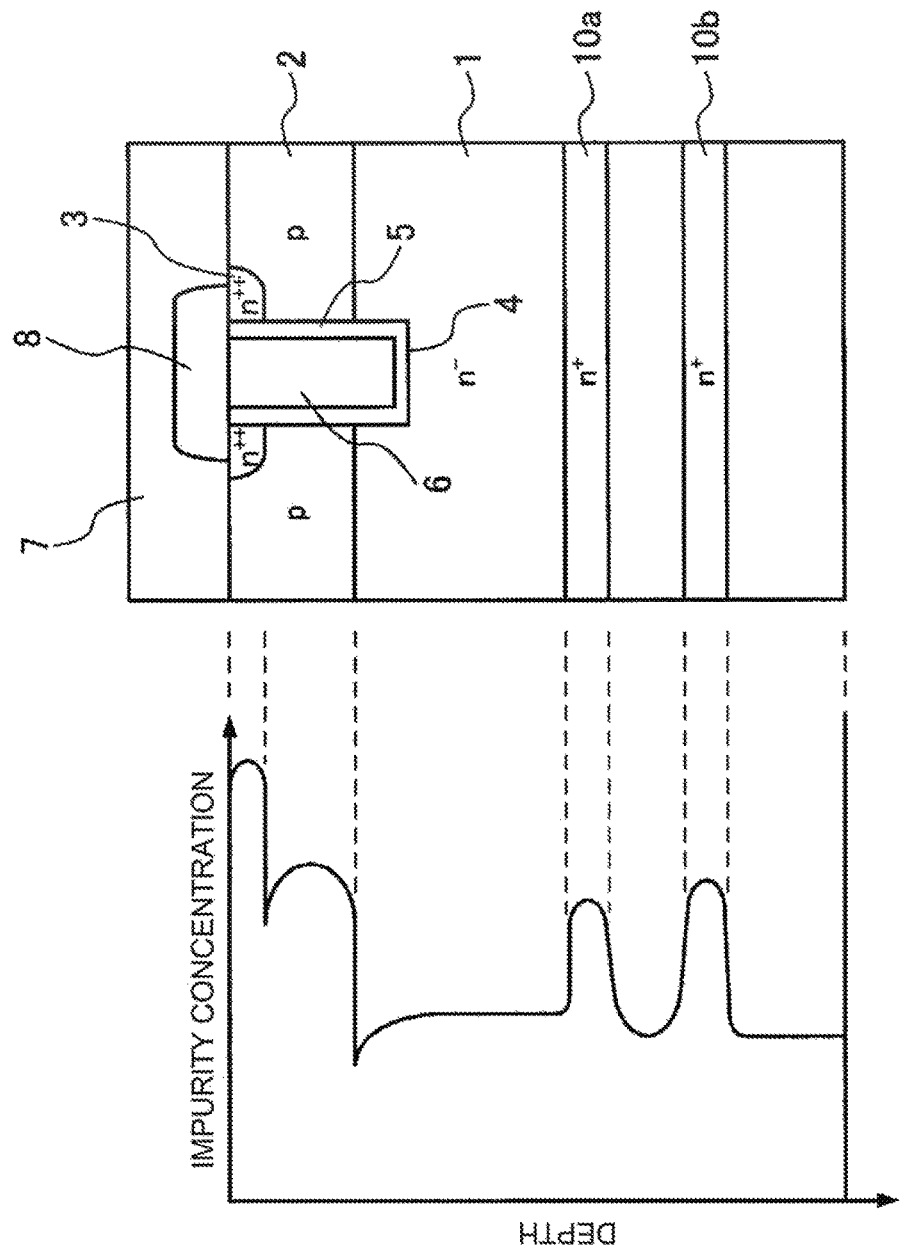
FIG. 9 is a cross-sectional view illustrating the semiconductor device according to Embodiment 1 which is being manufactured.

Then, as shown in FIG. 9, the radiated proton 21b is activated by the first annealing process and the n+ layer 10b is formed at a position that is a predetermined distance away from the rear surface of the semiconductor substrate and is shallower than the n+ layer 10a. In the first annealing process, the n+ layer 10b is annealed at an intermediate temperature which corresponds to the depth from the rear surface of the semiconductor substrate, among the annealing temperatures for forming the plurality of n+ layers 10a to 10c (a temperature lower than the annealing temperature for forming the n+ layer 10a). For example, the annealing temperature for forming the n+ layer 10b is 380° C. In this way, as shown on the left side of FIG. 9, it is possible to form the second n+ layer 10b with high impurity concentration in a region that is away from the n+ layer 10a as viewed from the p base region 2 formed on the front surface side of the semiconductor substrate. As such, the annealing temperature required to form the second deepest n+ layer 10b from the rear surface of the substrate is, for example, equal to or higher than 350° C. and equal to or lower than 420° C. and preferably, equal to or higher than 370° C. or equal to or less than 390° C.

Figure 10:
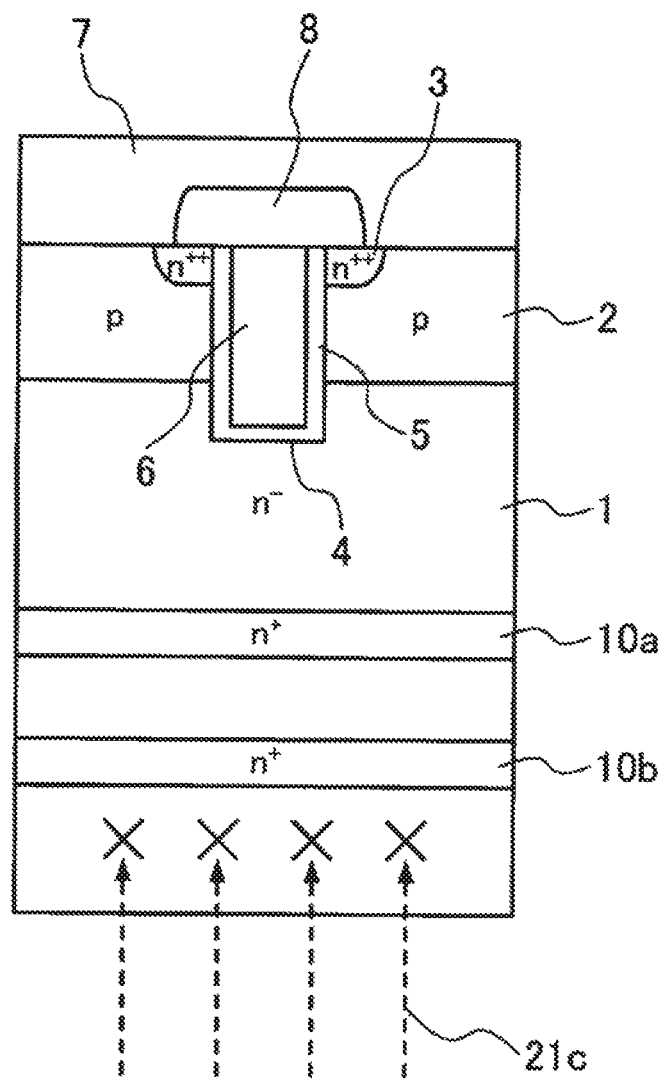
FIG. 10 is a cross-sectional view illustrating the semiconductor device according to Embodiment 1 which is being manufactured.

Then, the third n+ layer 10c is formed. Specifically, as shown in FIG. 10, a proton 21c is radiated to a region that is a predetermined distance from the rear surface of the semiconductor substrate and is shallower than the n+ layer 10b. At that time, the acceleration voltage of the proton irradiation depends on the depth from the rear surface of the semiconductor substrate and is the smallest value that is less than the acceleration voltage applied when the n+ layer 10b is formed. For example, when the depth of the n+ layer 10c from the rear surface of the substrate is 10 µm, the corresponding acceleration energy of the proton is 0.74 MeV. The depth of the n+ layer 10c from the rear surface of the substrate is in the typical range of 5 µm to 20 µm. In this case, the range of the acceleration energy is, for example, from 0.45 MeV to 1.17 MeV.

Figure 11:
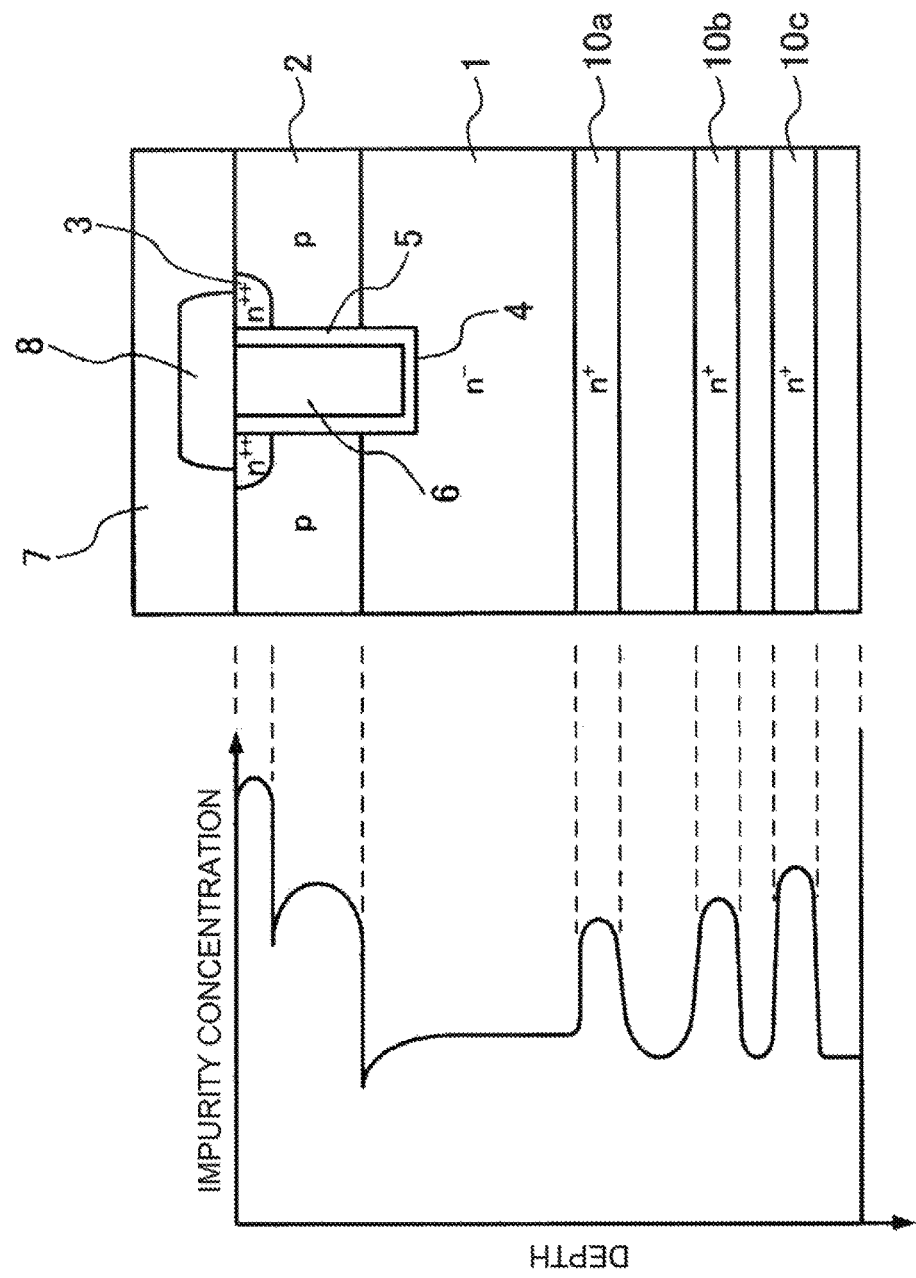
FIG. 11 is a cross-sectional view illustrating the semiconductor device according to Embodiment 1 which is being manufactured.

Then, as shown in FIG. 11, the radiated proton 21c is activated by the first annealing process and the n+ layer 10c is formed at a position that is a predetermined distance away from the rear surface of the semiconductor substrate and is shallower than the n+ layer 10b. In the first annealing process, the n+ layer 10c is annealed at the lowest temperature which corresponds to the depth from the rear surface of the semiconductor substrate, among the annealing temperatures for forming the plurality of n+ layers 10a to 10c (a temperature that is equal to or lower than the annealing temperature for forming the n+ layer 10b). For example, the annealing temperature for forming the n+ layer 10c is 360° C. In this way, as shown on the left side of FIG. 11, it is possible to form the third n+ layer 10c with a high impurity concentration in a region that is away from the n+ layer 10b as viewed from the p base region 2 formed on the front surface side of the semiconductor substrate. As such, the annealing temperature required to form the third deepest n+ layer 10c (which is at the shallowest position from the rear surface of the substrate in FIG. 11) from the rear surface of the substrate is, for example, equal to or higher than 340° C. and equal to or lower than 400° C., preferably equal to or higher than 350° C. and equal to or lower than 370° C., and more preferably has the lower limit higher than 350° C.

As described above, it is preferable that the first annealing process which is performed a plurality of times be performed at a temperature at which the hydrogen induced donors formed by, for example, proton irradiation are not reduced or vanished. The time of the annealing process may be in the range of 0.5 hour to 10 hours.

Figure 12:
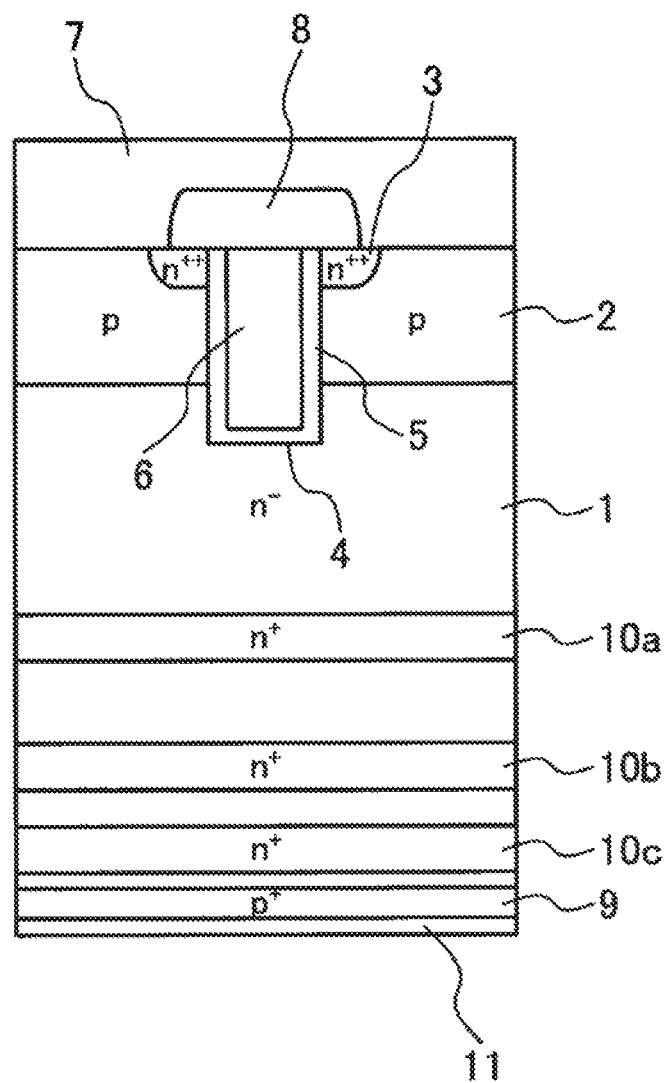
FIG. 12 is a cross-sectional view illustrating the semiconductor device according to Embodiment 1 which is being manufactured.

Then, p-type impurity ions, such as boron ions (B+), are implanted into the ground rear surface of the semiconductor substrate. Then, as shown in FIG. 12, the p-type impurity ions implanted into the rear surface of the semiconductor substrate are activated by a second annealing process and the p+ collector layer 9 is formed in the surface layer of the rear surface of the semiconductor substrate. Then, for example, a hydrogen fluoride (HF) treatment for reducing contact resistance with a silicon (Si) semiconductor layer and an aluminum film is performed as preprocessing for forming the collector electrode 11 which is made of a metal material having aluminum as a main component. Then, for example, aluminum, titanium (Ti), nickel (Ni), and gold (Au) are sequentially deposited on the rear surface of the semiconductor substrate by sputtering to form the collector electrode 11 in which the four metal films are laminated. Then, metal annealing for improving the surface formability of the collector electrode 11 is performed. In this way, the trench gate IGBT shown in FIG. 1 is completed.

In the above description, the proton irradiation and the first annealing process form a set and the proton irradiation and the annealing process are alternately performed. The sets of the proton irradiation process and the annealing process are sequentially performed, starting from the set of the proton irradiation process and the annealing process by which the n+ field stop layer 10 is formed at the deepest position from the rear surface of the semiconductor substrate. However, the invention is not limited thereto. When the annealing temperatures required to form the n+ layers 10a to 10c are equal to each other in a plurality of first annealing processes, a plurality of proton irradiation processes may be performed and then one annealing process may be performed to form the plurality of n+ layers. For example, when the annealing temperatures for forming the n+ layers 10b and 10c are equal to each other, two proton irradiation processes may be performed for the n+ layers 10b and 10c under different conditions and then one annealing process may be performed under one condition (annealing temperature). In this case, it is possible to reduce the number of annealing processes and to reduce the number of manufacturing processes.

When a portion of the first annealing process is performed under the same conditions (annealing temperature) as the second annealing process, a portion of the first annealing process and the second annealing process may be performed at the same time. However, the first annealing process and the second annealing process are performed at a temperature lower than the temperature of the previous annealing process. When the last second annealing process among a plurality of second annealing processes and a metal annealing process are performed at the same annealing temperature, the second annealing process and the metal annealing process may be performed at the same time.

In addition, a plurality of (multi-stage) $n^+$ layers may be formed, for example, under the following three conditions. The first condition is that, as the depth of the $n^+$ layer from an irradiation surface (the rear surface of the substrate) increases, a proton dose per $n^+$ layer is reduced ($5 \times 10^{12}/cm^2$ to $5 \times 10^{13}/cm^2$). When the dose is set to a small value, crystalline damage caused by high acceleration energy is reduced by a low dose.

The second condition is that, as the distance of the $n^+$ layer to the irradiation surface is reduced, that is, the depth of the $n^+$ layer is reduced, a proton dose per $n^+$ layer increases ($3 \times 10^{13}/cm^2$ to $3 \times 10^{14}/cm^2$). When the acceleration energy is reduced, crystalline damage is less than that when the acceleration energy is high. Therefore, a proton dose may be increased by a value corresponding to the reduction in the crystalline damage.

The third condition is that the residual amount of disorder in the vicinity of the $n^+$ layer 10c which is closest (shallowest from) to the irradiation surface may be more than that in the $n^+$ layers 10a and 10b which are formed at the deep positions from the rear surface of the substrate. Here, in plain words, the residual amount of disorder is considered as the rate at which carrier mobility is less than the theoretical value of a crystal. A depletion layer which is spread from a pn junction between the p base region 2 and the $n^-$ drift layer 1 may be designed such that the spreading of the depletion layer is suppressed by the deepest $n^+$ layer 10c and the depletion layer is not spread any further. In this case, even when disorder remains in a region between the $n^+$ layer 10c which is at the deepest position from the rear surface of the substrate and the rear surface of the substrate, it is possible to reduce the influence of the disorder on a leakage current. When the gate is turned on, the injection efficiency of holes from the $p^+$ collector layer 9 formed on the rear surface of the substrate can be reduced by the disorder. Therefore, it is possible to improve, for example, the trade-off characteristics between an on-voltage and turn-off loss.

As described above, according to Embodiment 1, the plurality of $n^+$ layers 10a to 10c with a high impurity concentration are formed as the $n^+$ field stop layer 10 in the depth direction of the semiconductor substrate. The plurality of (multi-stage) $n^+$ layers 10a to 10c make it possible to prevent the depletion layer which is spread from the pn junction between the p base region 2 and the n drift layer 1 from reaching the $p^+$ collector layer 9.

The proton irradiation and annealing conditions are defined by a set of proton irradiation and annealing on the basis of the position of the $n^+$ layer to be formed on the semiconductor substrate. Therefore, it is possible to increase the impurity concentration of each of the plurality of $n^+$ layers. As such, when annealing is performed using annealing conditions suitable for the conditions of a plurality of proton irradiation processes, it is possible to recover each crystal defect formed by each proton irradiation process and to increase each carrier concentration. In addition, it is possible to improve poor electrical characteristics, such as an increase in leakage current.

The number of $n^+$ layers 10a to 10c which are formed as the $n^+$ field stop layer 10 can be determined on the basis of, for example, the thickness of the semiconductor substrate or the level of the breakdown voltage (or the rated voltage) of a semiconductor element. As the rated voltage increases, the thickness of the semiconductor substrate needs to increase. Therefore, as the thickness of the semiconductor substrate increases, the number of $n^+$ layers which are formed as the $n^+$ field stop layer 10 may increase. For example, when the rated voltage is 600 V, the number of $n^+$ layers may be 1 to 3. When the rated voltage is 1200 V, the number of $n^+$ layers may be 2 to 4. When the rated voltage is 1700 V, the number of $n^+$ layers may be 3 to 5. When the rated voltage is 3300 V, the number of $n^+$ layers may be 4 to 6.

(Embodiment 2)

Figure 13:
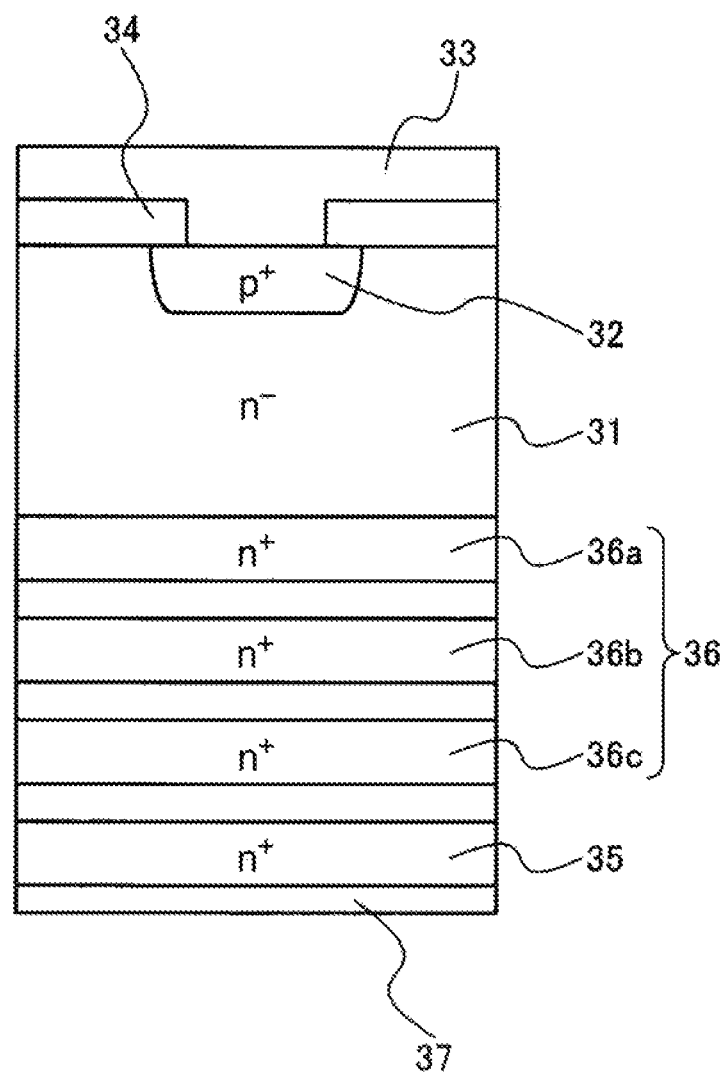
FIG. 13 is a cross-sectional view illustrating an example of a semiconductor device manufactured by a semiconductor device manufacturing method according to Embodiment 2.

FIG. 13 is a cross-sectional view illustrating an example of a semiconductor device manufactured by a semiconductor device manufacturing method according to Embodiment 2. The semiconductor device manufacturing method according to Embodiment 2 differs from the semiconductor device manufacturing method according to Embodiment 1 in that a diode is manufactured instead of the IGBT.

In the semiconductor device according to the semiconductor device manufacturing method according to Embodiment 2 shown in FIG. 13, a $p^+$ anode region 32 is selectively provided in a surface layer of a front surface of an $n^-$ semiconductor substrate 31. Reference numeral 34 indicates an interlayer insulating film. An anode electrode (input electrode) 33 comes into contact with the $p^+$ anode region 32. An $n^+$ cathode layer (first semiconductor layer) 35 is provided in a surface layer of a rear surface of the $n^-$ semiconductor substrate 31 and an $n^+$ field stop layer 36 is provided in a region which is deeper than the $n^+$ cathode layer 35 from the rear surface.

The $n^+$ field stop layer 36 has the same structure as the $n^+$ field stop layer according to Embodiment 1 and includes a plurality of $n^+$ layers 36a to 36c in the depth direction of the semiconductor substrate. A cathode electrode (output electrode) 37 comes into contact with the $n^+$ cathode layer 35. The impurity concentration of the $n^+$ cathode layer 35 is high enough to obtain ohmic contact with the cathode electrode 37.

In the above-described Embodiment 2, it is possible to manufacture the semiconductor device using the same process as that in Embodiment 1. Therefore, it is possible to perform a set of proton irradiation and annealing a plurality of times while changing conditions to form a plurality of $n^+$ layers. Then, annealing is performed under annealing conditions suitable for the conditions of a plurality of proton irradiation processes to increase the concentration (doping concentration) of a hydrogen induced donor layer formed by each proton irradiation process. In addition, each crystal defect (disorder) which is introduced by proton irradiation is recovered to improve poor electrical characteristics, such as an increase in leakage current. According to Embodiment 2, even when a diode is formed, it is possible to form an $n^+$ field stop layer with a desired doping concentration.

EXAMPLE

Figure 14:
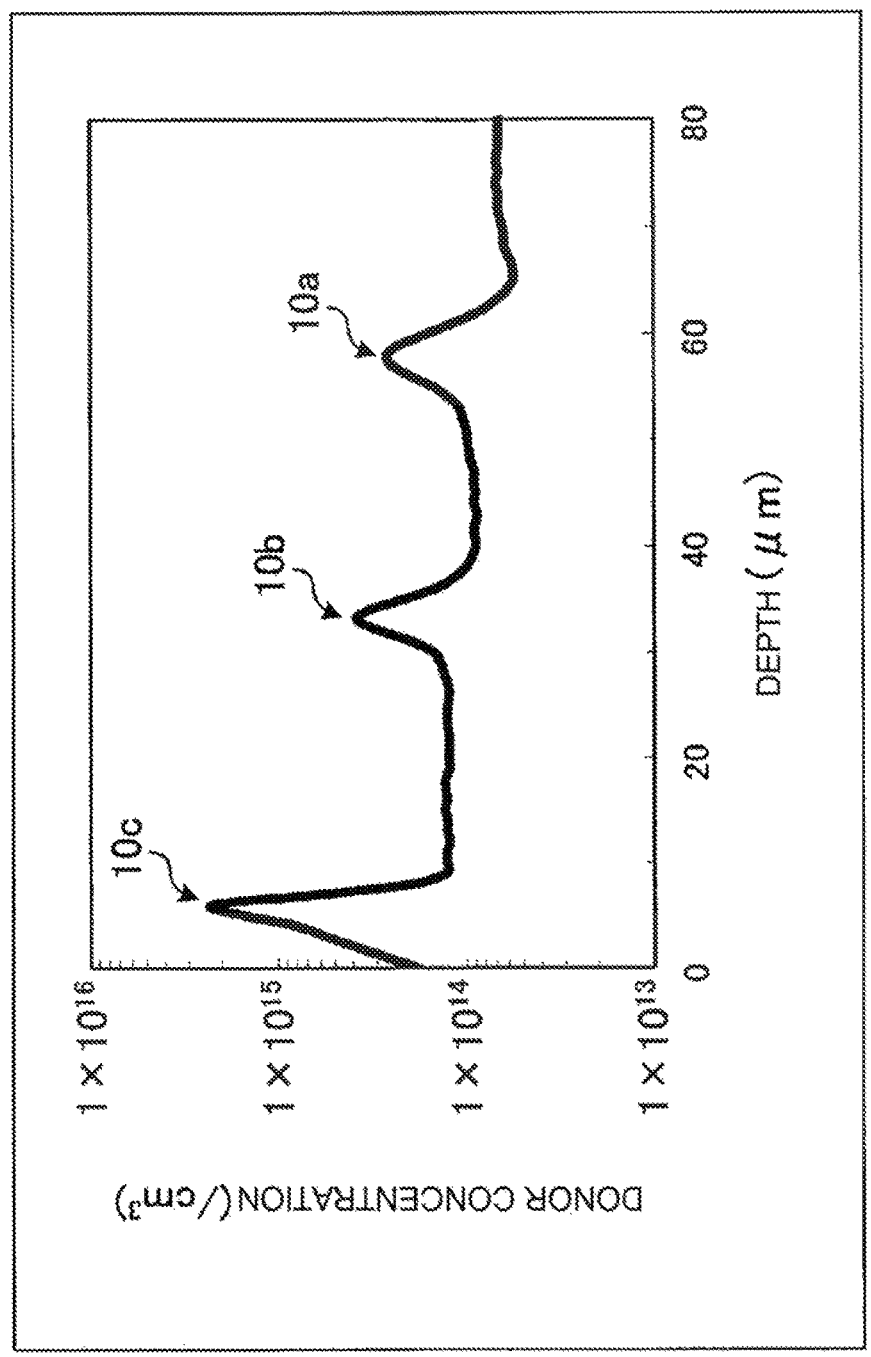
FIG. 14 is a characteristic diagram illustrating a carrier concentration distribution of the semiconductor device according to the embodiment.
Figure 15:
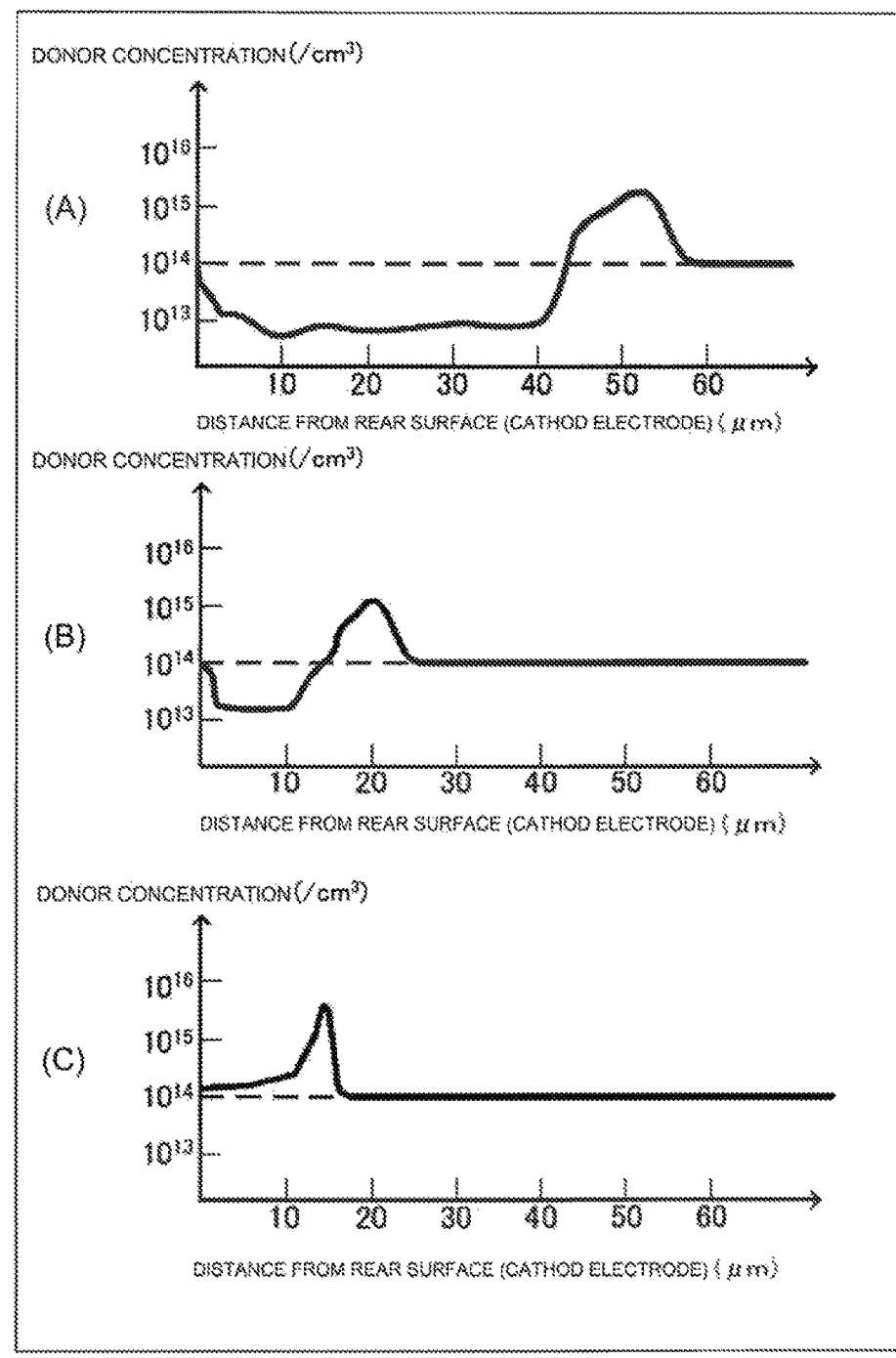
FIG. 15 is a characteristic diagram illustrating the relation between the average range of proton irradiation and carrier concentration in the related art.

Next, the doping concentration of a semiconductor layer was verified. FIG. 14 is a characteristic diagram illustrating a carrier concentration distribution of a semiconductor device according to an example which is measured by a known spreading resistance analysis method. A sample which was subjected to the proton irradiation (Step S5) and the first annealing process (Step S6) in the semiconductor device manufacturing method according to Embodiment 1 was prepared (hereinafter, referred to as an example).

Among the $n^+$ layers 10a to 10c, the $n^+$ layer 10a is provided at the deepest position from the rear surface of the semiconductor substrate is the largest and has the highest acceleration voltage during proton irradiation. The n+ layer 10c is provided at the shallowest position from the rear surface of the semiconductor substrate and has the lowest acceleration voltage during proton irradiation. The n+ layer 10a which is provided at the deepest position has the highest acceleration voltage, followed by the n+ layer 10b and the n+ layer 10c. In addition, the n+ layer 10a has the highest annealing temperature, followed by the n+ layer 10b and the n+ layer 10c. For example, the annealing temperature for forming the n+ layer 10a is 450° C. and the annealing temperature for forming the n+ layer 10b and the n+ layer 10c is 380° C. In this case, two proton irradiation processes and one annealing process (at a temperature of 380° C.) are performed for the n+ layer 10b and the n+ layer 10c.

The result shown in FIG. 14 proved that, in the example, a plurality of n+ layers 10a to 10c were formed in the depth direction of the semiconductor substrate to increase the impurity concentration. In particular, since there is no region in which the impurity concentration is significantly reduced other than the n+ layers 10a to 10c, it is possible to sufficiently reduce the disorder which is introduced by proton irradiation. In addition, since the regions of the n+ layers 10a to 10c each have high impurity concentration, it is possible to obtain a hydrogen induced donor layer with a high activation rate. For example, when the plurality of n+ layers 10a to 10c are collectively annealed at the same temperature and the annealing temperature is low as in the method according to the related art, a disorder layer can be formed by proton irradiation and the mobility of electrons and holes is reduced. Therefore, a region in which the impurity concentration is significantly reduced can be formed other than the n+ layers 10a to 10c. However, in the example according to the invention, it is possible to prevent the problem. In addition, when the plurality of n+ layers 10a to 10c are collectively annealed at the same temperature and the annealing temperature is high (higher than 500° C.), the hydrogen induced donor layer has a low concentration or is vanished and the impurity concentration of the n+ layer 10c which is formed at the shallow position from the rear surface of the semiconductor substrate is reduced. However, in the example according to the invention, it is possible to prevent a reduction in the hydrogen induced donors.

(Embodiment 3)

Next, the preferred position of the proton peak of a first-stage field stop layer in a plurality of proton implantation processes of the semiconductor device manufacturing method according to the invention will be described as Embodiment 3. The first-stage field stop layer means an n+ field stop layer which is disposed at the deepest position from the rear surface of a substrate, which is an n+ cathode layer in the case of a diode and is a collector layer in the case of an IGBT, in the depth direction.

Figure 17:
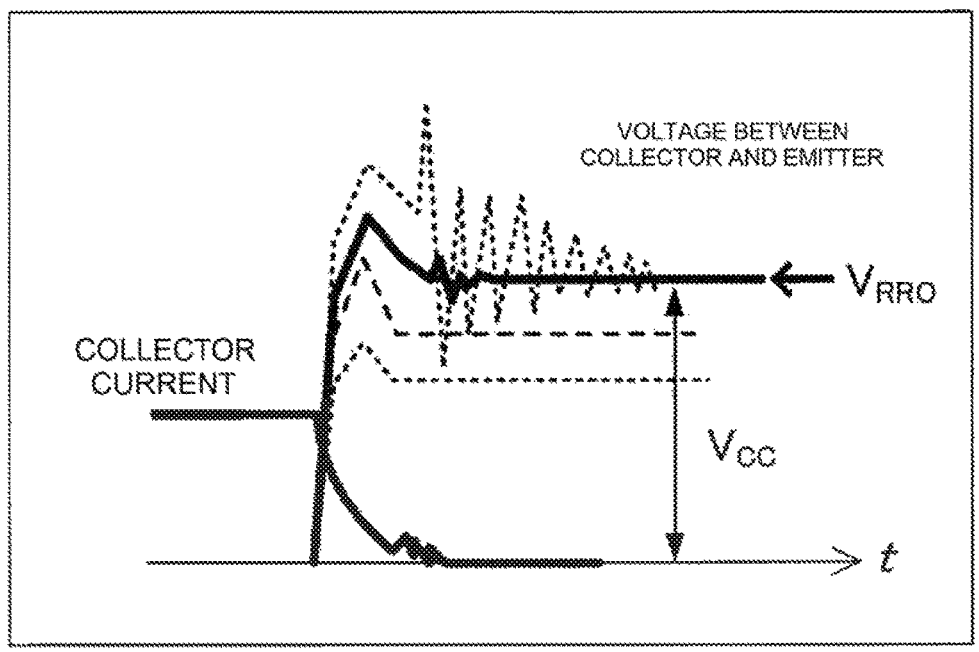
FIG. 17 is a characteristic diagram illustrating a turn-off oscillation waveform of a general IGBT.

FIG. 17 shows a characteristic diagram illustrating the turn-off oscillation waveform of a general IGBT. When a collector current is equal to or less than a tenth of a rated current, oscillation is likely to occur before turn-off ends since the number of stored carriers is small. The collector current is fixed to a given value and the IGBT is turned off by a different power supply voltage $V_{CC}$. In this case, when the power supply voltage $V_{CC}$ is greater than a predetermined value, the voltage is greater than the peak value of a general overshoot voltage in a voltage waveform between the collector and the emitter and then an additional overshoot occurs. Then, the additional overshoot (voltage) triggers the oscillation of the subsequent waveform. When the power supply voltage $V_{CC}$ is greater than the predetermined value again, an additional overshoot voltage further increases and the amplitude of the subsequent oscillation increases. As such, a threshold voltage at which the voltage waveform starts to oscillate is referred to as an oscillation start threshold value $V_{RRO}$. As the oscillation start threshold value $V_{RRO}$ increases, the possibility of the IGBT oscillating when the IGBT is turned off is reduced, which is preferable.

The oscillation start threshold value $V_{RRO}$ depends on the position of a first proton peak (closest to the p base region) which a depletion layer (strictly, a space-charge region since there is a hole), which is spread from a pn junction between the p base region and the n− drift layer of the IGBT to the n− drift layer, reaches first. The reason is as follows. When the depletion layer is spread from the pn junction between the p base region and the n− drift layer to the n− drift layer at the time the IGBT is turned off, the end of the depletion layer reaches the first n+ field stop layer (closest to the p base region) and the spreading of the depletion layer is suppressed. Therefore, the sweep of the stored carriers is weakened. As a result, the depletion of carriers is suppressed and the oscillation of the turn-off oscillation waveform is suppressed.

When the IGBT is turned off, the depletion layer is spread in the depth direction from the pn junction between the p base region and the n− drift layer to the collector electrode. Therefore, the peak position of the n+ field stop layer which the end of the depletion layer reaches first is the n+ field stop layer which is closest to the pn junction between the p base region and the n drift layer. Here, it is assumed that the thickness of the semiconductor substrate (the thickness of a portion interposed between the emitter electrode and the collector electrode) is $W_0$ and the depth of the peak position of the n+ field stop layer which the end of the depletion layer reaches first from the interface (boundary) between the collector electrode and the rear surface of the semiconductor substrate (hereinafter, referred to as a distance from the rear surface) is X. Here, a distance index L is introduced. The distance index L is represented by the following Expression (3).

$$L = \sqrt{\frac{\varepsilon_S V_{rate}}{\left(\frac{J_F}{qv_{sat}} + N_d\right)}} \quad \text{[Expression (3)]}$$

The distance index L represented by the above-mentioned Expression (3) is an index indicating the distance of the end of the depletion layer (exactly, a space-charge region) (depletion layer end), which is spread from the pn junction between the p base region and the n drift layer to the n− drift layer 1, from the pn junction when a voltage $V_{CE}$ between the collector and the emitter that increases at the time the IGBT is turned off is equal to the power supply voltage $V_{CC}$. In a fraction in the square root, a denominator indicates the space-charge density of the space-charge region (depletion layer) when the IGBT is turned off. The known Poisson's equation is represented by $\text{div}E=\rho/\varepsilon_s$ (where E is electric field intensity, $\rho$ is the space-charge density, and $\rho=q(p-n+N_d-N_a)$ is established). In addition, q is an elementary charge, p is a hole concentration, n is an electron concentration, $N_d$ is a donor concentration, $N_a$ is an acceptor concentration, and $\varepsilon_s$ is the permittivity of a semiconductor. In particular, the donor concentration $N_d$ is an average concentration obtained by integrating the n− drift layer in the depth direction and dividing the integrated value by the length of the integration section.

The space-charge density ρ is described by the hole concentration p in the space-charge region (depletion layer) when the IGBT is turned off and the average donor concentration $N_d$ of the n⁻ drift layer. The space-charge density ρ can be represented by $\rho \approx q(p+N_d)$ since the electron concentration is negligibly less than the space-charge density ρ and there is no acceptor. In this case, the hole concentration p is determined by a breaking current of the IGBT. In particular, the hole concentration p is represented by $p=J_F/(qv_{sat})$ since a situation in which the rated current density of the element flows is assumed (where $J_F$ is the rated current density of the element and $v_{sat}$ is a saturated speed at which the speed of carriers is saturated with predetermined electric field intensity).

The Poisson's equation is integrated with respect to the distance x two times and a voltage V satisfies E=−gradV (the relationship between a known electric field E and the voltage V). Therefore, when boundary conditions are appropriate, $V=(½)(\rho/\varepsilon_s)x^2$ is established. The length x of the space-charge region when the voltage V is half of the rated voltage $V_{rate}$ is the distance index L. The reason is that, in the actual device, such as an inverter, an operating voltage (power supply voltage $V_{CC}$), which is the voltage V, is about half of the rated voltage $V_{rate}$. When the doping concentration of the field stop layer is higher than that of the n⁻ drift layer, the field stop layer has a function of making it difficult for the space-charge region to be spread when the IGBT is turned off. In a case in which the collector current of the IGBT starts to be reduced from the breaking current due to the turn-on of a MOS gate of the IGBT, when the peak position of the n⁺ field stop layer which the depletion layer reaches first is in the range of the length of the space-charge region, it is possible to suppress the spreading of the space-charge region, with the stored carriers remaining in the n⁻ drift layer. Therefore, the sweep of the remaining carriers is suppressed.

For example, in the actual turn-off operation, when an IGBT module is driven by a known PWM inverter, in many cases, the power supply voltage $V_{CC}$ or the breaking current is not fixed, but is variable. Therefore, in this case, the preferred peak position of the n⁺ field stop layer which the depletion layer reaches first needs to have a certain width. The inventors' examination result proved that the distance X of the peak position of the n⁺ field stop layer which the depletion layer reached first from the rear surface was as shown in FIG. 19. FIG. 19 is a diagram illustrating the position conditions of the field stop layer which the depletion layer reaches first in the semiconductor device according to the invention. FIG. 19 shows the distance X of the peak position of the n⁺ field stop layer which the end of the depletion layer reaches first from the rear surface at a rated voltage $V_{rate}$ of 600 V to 6500 V. Here, $X=W_0-\gamma L$ is established and γ is a coefficient. FIG. 19 shows the distance X when the coefficient γ is changed from, for example, 0.7 to 1.6.

As shown in FIG. 19, the safe design is made at each rated voltage $V_{rate}$ such that the element (IGBT) has a breakdown voltage that is about 10 percent higher than the rated voltage $V_{rate}$. As shown in FIG. 19, the total thickness of the semiconductor substrate (the thickness of the semiconductor substrate during a finishing process after the semiconductor substrate is thinned by, for example, grinding) and the average specific resistance of the n⁻ drift layer are set such that an on-voltage or turn-off loss is sufficiently reduced. The term "average" means the average concentration and specific resistance of the entire n⁻ drift layer including the n⁺ field stop layer. As shown in FIG. 19, the rated current density $J_F$ has a typical value, depending on the rated voltage $V_{rate}$. The rated current density $J_F$ is set such that energy density which is determined by the product of the rated voltage $V_{rate}$ and the rated current density $J_F$ is substantially constant and substantially has the value shown in FIG. 19. When the distance index L is calculated by the above-mentioned Expression (3) on the basis of these values, the value shown in FIG. 19 is obtained. The distance X of the peak position of the n⁺ field stop layer which the end of the depletion layer reaches first from the rear surface is obtained by subtracting the value of γ which is in the range of 0.7 to 1.6 with respect to the distance index L from the thickness $W_0$ of the semiconductor substrate.

Figure 16:
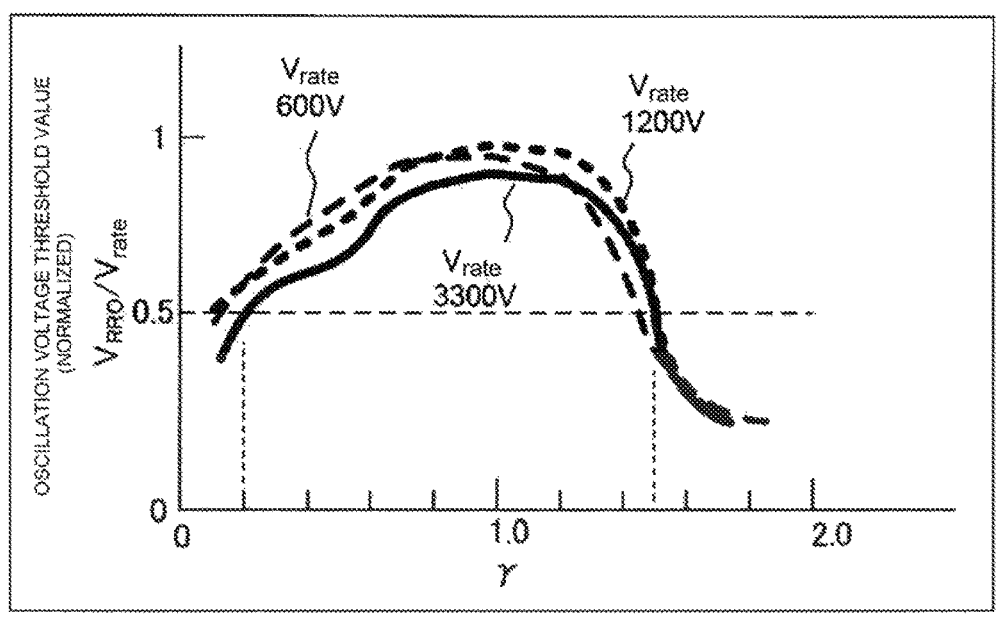
FIG. 16 is a characteristic diagram illustrating a threshold voltage at which a voltage waveform starts to oscillate.

The coefficient γ for determining the distance X of the peak position of the n⁺ field stop layer which the end of the depletion layer reaches first from the rear surface, at which turn-off oscillation is sufficiently suppressed, with respect to the distance index L and the thickness $W_0$ of the semiconductor substrate, is as follows. FIG. 16 is a characteristic diagram illustrating a threshold voltage at which the voltage waveform starts to oscillate. FIG. 16 shows the dependence of the oscillation start threshold value $V_{RRO}$ on γ at some typical rated voltages $V_{rate}$ (600 V, 1200 V, and 3300 V). Here, the vertical axis indicates a value obtained by normalizing the oscillation start threshold value $V_{RRO}$ with the rated voltage $V_{rate}$. As can be seen from FIG. 16, it is possible to rapidly increase the oscillation start threshold value $V_{RRO}$ together with three rated voltages $V_{rate}$ at γ of 1.5 or less.

As described above, in the actual device, such as an inverter, the operating voltage (power supply voltage $V_{CC}$) which is the voltage V is about half of the rated voltage $V_{rate}$. Therefore, when the power supply voltage $V_{CC}$ is half of the rated voltage $V_{rate}$, at least the turn-off oscillation of the IGBT should not occur. That is, the value of $V_{RRO}/V_{rate}$ needs to be equal to or greater than 0.5. As shown in FIG. 16, when γ is equal to or greater than 0.2 and equal to or less than 1.5, the value of $V_{RRO}/V_{rate}$ is equal to or greater than 0.5. Therefore, it is preferable that γ be at least in the range of 0.2 to 1.5.

At a voltage between 600 V and 1200 V (for example, 800 V or 1000 V), a voltage between 1200 V and 3300 V (for example, 1400 V, 1700 V, or 2500 V), and a voltage equal to or higher than 3300 V (for example, 4500 V or 6500 V) which are not shown, the oscillation start threshold value $V_{RRO}$ does not greatly deviate from three curves shown in FIG. 16 and has the same dependence as the three curves (the oscillation start threshold value $V_{RRO}$ with respect to γ). As can be seen from FIG. 16, there is a region in which the oscillation start threshold value $V_{RRO}$ can be sufficiently increased at any rated voltage $V_{rate}$ when γ is in the range of 0.7 to 1.4.

When γ is less than 0.7, the oscillation start threshold value $V_{RRO}$ is about equal to or higher than 80% of the rated voltage $V_{rate}$, but the avalanche breakdown voltage of the element is likely to be lower than the rated voltage $V_{rate}$ since the n⁺ field stop layer is close to the p base region. Therefore, it is preferable that γ be equal to or greater than 0.7. When γ is greater than 1.4, the oscillation start threshold value $V_{RRO}$ is rapidly reduced from about 70% of the rated voltage $V_{rate}$ and turn-off oscillation is likely to occur. Therefore, it is preferable that γ be equal to or less than 1.4. In addition, γ is more preferably in the range of 0.8 to 1.3 and most preferably in the range of 0.9 to 1.2. In this case, it is possible to maximize the oscillation start threshold value $V_{RRO}$ while increasing the avalanche breakdown voltage of the element to be sufficiently higher than the rated voltage $V_{rate}$.

The important point in the effect of the invention shown in FIG. 16 is that the range of γ which can sufficiently increase the oscillation start threshold value $V_{RRO}$ is substantially the same (for example, 0.7 to 1.4) at any rated voltage $V_{rate}$. The reason is as follows: it is most effective to set the range of the distance X of the peak position of the n⁺ field stop layer which the depletion layer reaches first from the rear surface to be centered on $W_0$–L (γ=1). It is most effective to include γ=1.0 since power density (the product of the rated voltage $V_{rate}$ and the rated current density $J_F$) is substantially constant (for example, $1.8 \times 10^5$ VA/cm² to $2.6 \times 10^5$ VA/cm²). That is, when the voltage of the element is equivalent to the rated voltage $V_{rate}$ during switching, such as turn-off, the distance (depth) of the end of the space-charge region is equal to about the distance index L represented by the above-mentioned Expression (3). When the peak position of the n⁺ field stop layer which is disposed at the deepest position from the rear surface is aligned with the position of the distance index L (that is, γ is about 1.0), it is possible to suppress oscillation during switching. Since power density is substantially constant, the distance index L is proportional to the rated voltage $V_{rate}$. Therefore, in the range which has γ=1.0 substantially as the center, it is possible to sufficiently increase the oscillation start threshold value $V_{RRO}$ at any rated voltage $V_{rate}$ and to maximize the oscillation inhibitory effect during switching.

As described above, when the distance X of the peak position of the n⁺ field stop layer which the end of the depletion layer reaches first from the rear surface is set in the above-mentioned range, the stored carriers can sufficiently remain in the IGBT when the IGBT is turned off and it is possible to suppress an oscillation phenomenon when the IGBT is turned off. Therefore, for the distance X of the peak position of the n⁺ field stop layer which the end of the depletion layer reaches first from the rear surface, the coefficient γ of the distance index L may be in the above-mentioned range at any rated voltage $V_{rate}$. In this case, it is possible to effectively suppress the oscillation phenomenon when the IGBT is turned off.

As can be seen from FIG. 19, as described above, when the depth of the first (first-stage) n⁺ field stop layer, which is disposed at the deepest position from the rear surface, from the rear surface is set such that γ is about 1 at a rated voltage $V_{rate}$ of 600 V or more, the distance index L is greater than 20 μm at any rated voltage $V_{rate}$. That is, the range Rp of protons for forming the first proton peak at the deepest position from the rear surface of the substrate is deeper than 15 μm, particularly, equal to or deeper than 20 μm from the rear surface of the substrate in order to maximize the oscillation inhibitory effect.

As described above, in order to obtain good switching characteristics, it is necessary to form the n⁺ field stop layer in a region which is deeper than at least 15 μm from the rear surface of the semiconductor substrate. The concept of the distance index L and the preferred range of γ in the IGBT can be similarly applied to a diode. That is, the oscillation phenomenon when the IGBT is turned off may be considered to be replaced with the oscillation phenomenon during reverse recovery. In this case, the likeliness of oscillation and the effect of suppressing the oscillation are the same as those for the reverse recovery oscillation.

Figure 20:
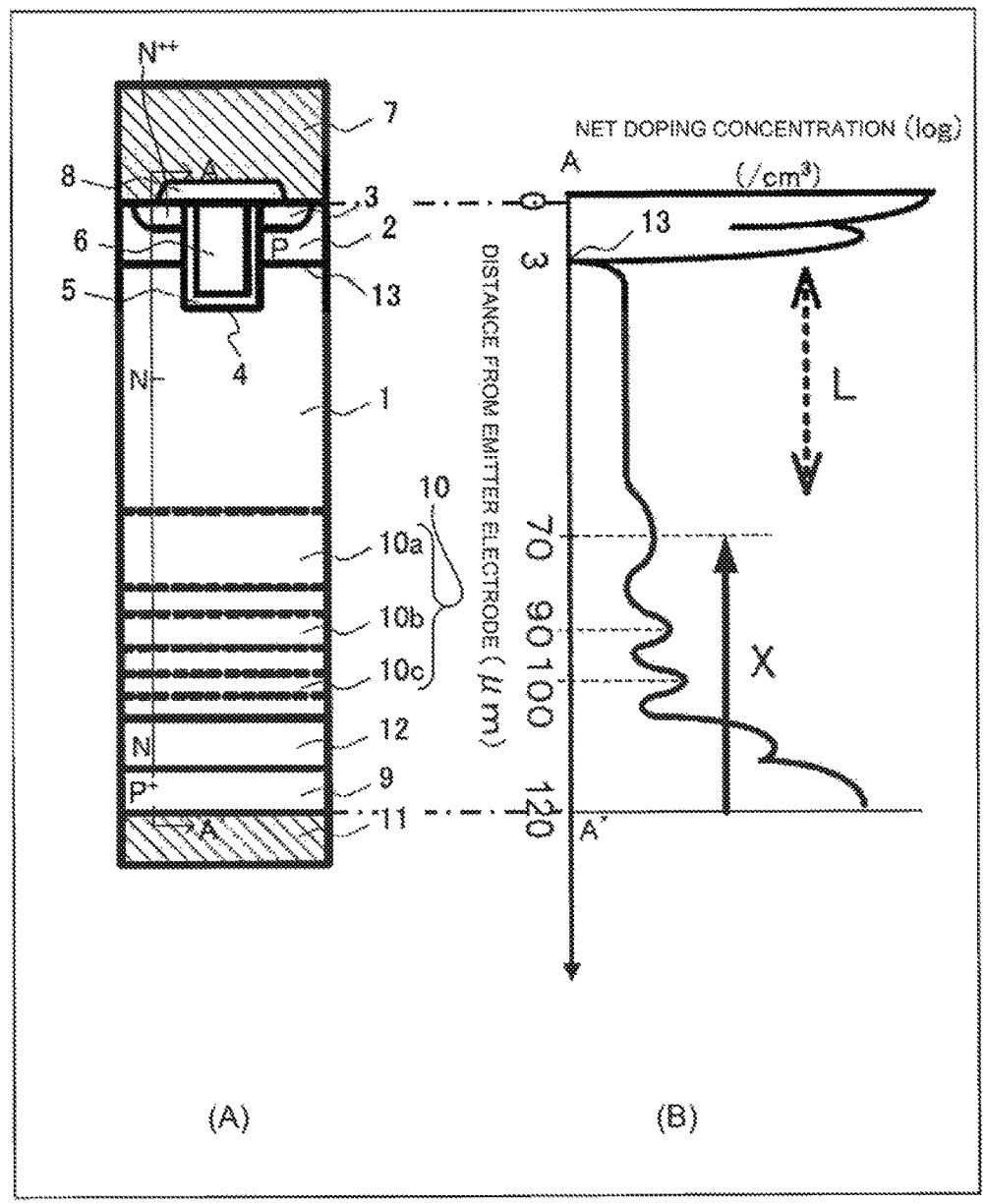
FIG. 20 is a diagram illustrating the depth of an interface between an emitter electrode of a field stop layer and a front surface of a substrate in the semiconductor device according to Embodiment 1.

FIG. 20 is a diagram illustrating the depth from the interface between the emitter electrode of the field stop layer and the front surface of the substrate in the semiconductor device according to Embodiment 1. FIG. 20(A) is a cross-sectional view illustrating an IGBT including a plurality of n⁺ field stop layers. FIG. 20(B) shows a net doping concentration distribution along the cutting line A-A' of FIG. 20(A) with respect to the distance (depth) from the interface between the emitter electrode 7 and the front surface of the substrate. For example, the n⁺ field stop layers 10 are formed in three stages in a region of the n drift layer 1 close to the p⁺ collector layer 9 at different depths from the rear surface of the substrate. The distance X of the peak position of the n⁺ field stop layer 10 (n⁺ layer 10a), which is disposed at the deepest position from the rear surface of the substrate, from the rear surface of the substrate is 50 μm. This corresponds to a case in which the distance index L is 58.2 μm and γ is 1.2 on the basis of the diagram shown in FIG. 19. An arrow L shown in FIG. 20(B) indicates, for example, the distance (length) from the pn junction 13 between the p base region 2 and the n⁻ drift layer 1. Reference numeral 12 indicates an n buffer layer.

Figure 21:
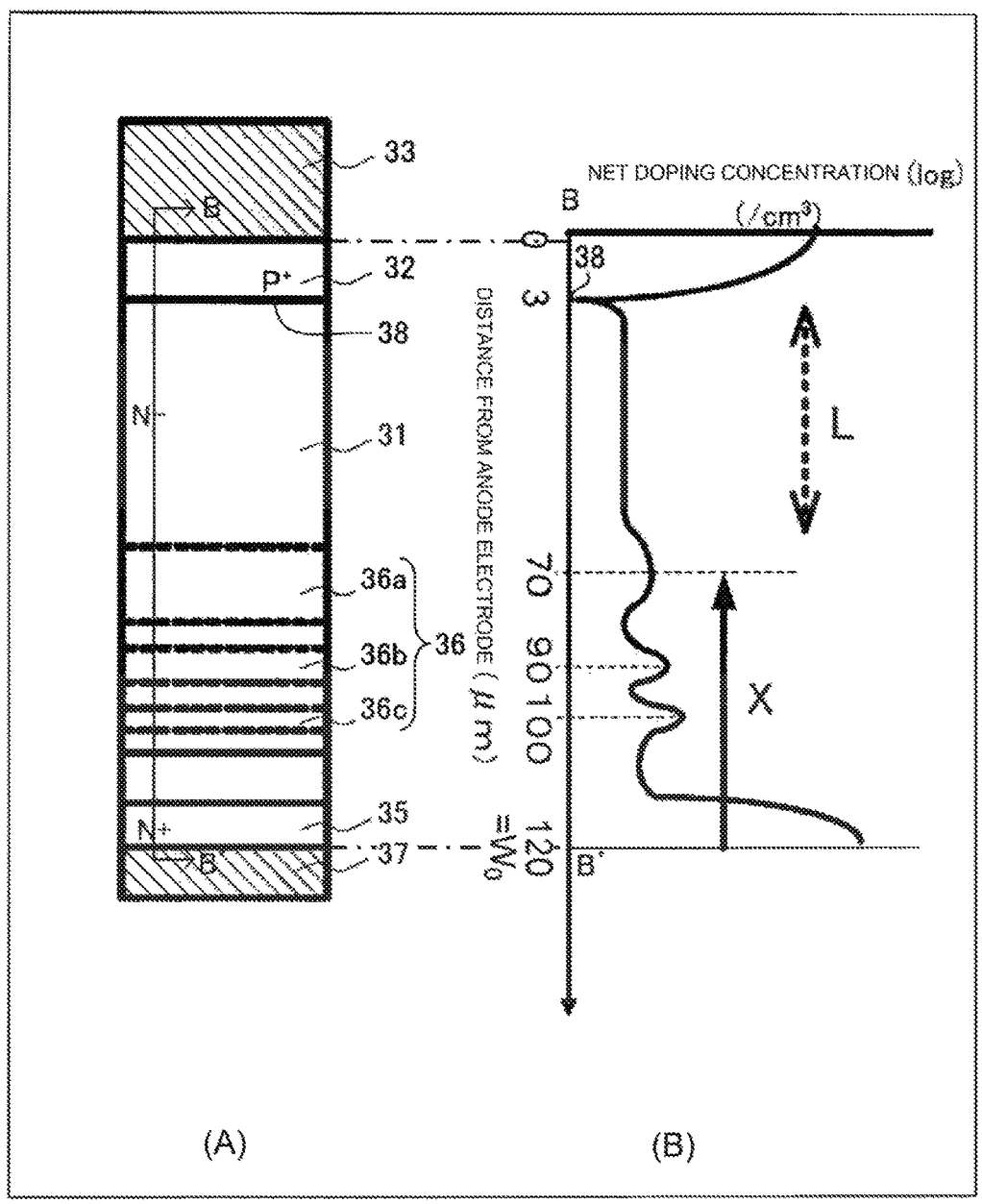
FIG. 21 is a diagram illustrating the depth of an interface between an anode electrode of a field stop layer and a front surface of a substrate in the semiconductor device according to Embodiment 2.

FIG. 21 is a diagram illustrating the depth from the interface between the anode electrode of the field stop layer and the front surface of the substrate in the semiconductor device according to Embodiment 2. FIG. 21(A) is a cross-sectional view illustrating the diode including a plurality of n⁺ field stop layers. FIG. 21(B) shows a net doping concentration distribution along the cutting line B-B' of FIG. 21(A) with respect to the distance (depth) from the interface between the anode electrode 33 and the front surface of the substrate. For example, the n⁺ field stop layers 36 are formed in three stages in a region close to the n⁺ cathode layer 35 in the semiconductor substrate 31, which will be an n⁻ drift layer, at different depths from the rear surface. The distance X of the peak position of the n⁺ field stop layer 36 (n⁺ layer 36a), which is disposed at the deepest position from the rear surface of the substrate, from the rear surface of the substrate is 50 μm. This corresponds to a case in which the distance index L is 58.2 μm and γ is 1.2 on the basis of the diagram shown in FIG. 19. An arrow L shown in FIG. 21(B) indicates, for example, the distance (length) from the pn junction 38 between the p⁺ anode region 32 and the n⁻ drift layer.

(Embodiment 4)

Figure 18:
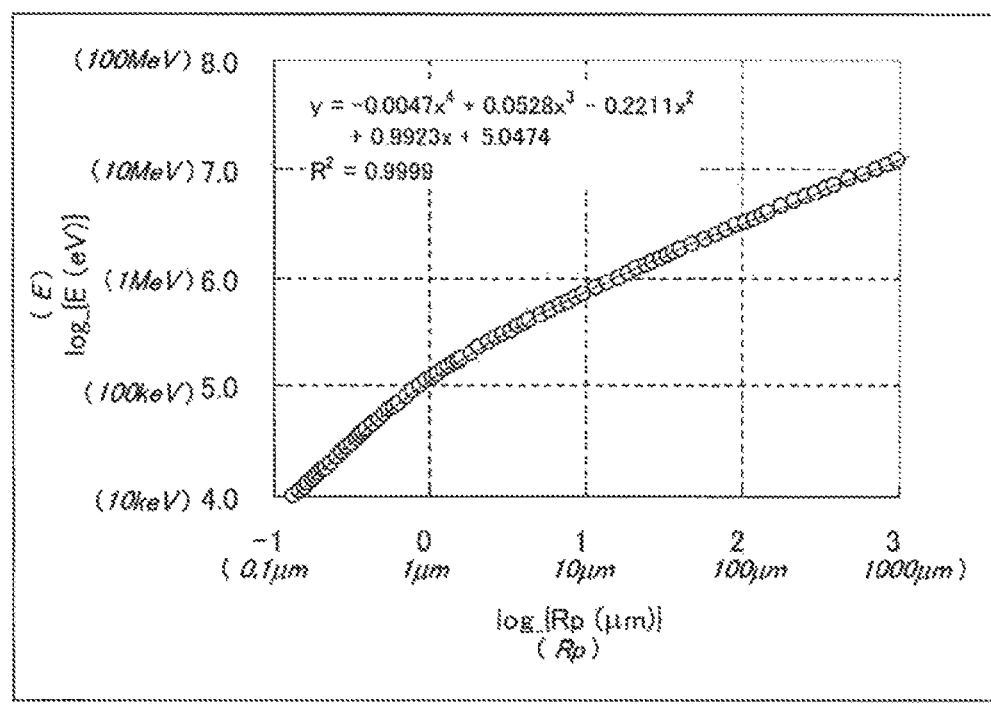
FIG. 18 is a characteristic diagram illustrating between the range of a proton and the acceleration energy of the proton in the semiconductor device according to the invention.

Next, the acceleration energy of a proton in the semiconductor device manufacturing method according to the invention will be described as a fourth embodiment. The acceleration energy of the proton may be determined from the characteristic diagram shown in FIG. 18 in order to actually form an n⁺ field stop layer using proton implantation such that the peak position of the n⁺ field stop layer which a depletion layer reaches first has a distance X from the rear surface of a substrate and the above-mentioned range of γ is satisfied. FIG. 18 is the characteristic diagram illustrating the relationship between the average range of the proton and the acceleration energy of the proton in the semiconductor device according to the invention.

The inventors' examination result proved that, when the logarithm log(Rp) of the average range Rp of the proton (the peak position of the field stop layer) was x and the logarithm log(E) of the acceleration energy E of the proton was y, the average range Rp of the proton and the acceleration energy E of the proton satisfied the relationship represented by the following Expression (4).

$$y = -0.0047x^4 + 0.0528x^3 - 0.2211x^2 + 0.9923x + 5.0474 \quad \text{[Expression (4)]}$$

FIG. 18 is the characteristic diagram illustrating the above-mentioned Expression (4) and shows the acceleration energy of the proton for obtaining the desired average range Rp of the proton. In FIG. 18, the horizontal axis indicates the logarithm log(Rp) of the average range Rp of the proton and a corresponding average range Rp (μm) is described in parentheses below the axis value of log(Rp). In addition, the vertical axis indicates the logarithm log(E) of the acceleration energy E of the proton and the corresponding acceleration energy E of the proton is described in parentheses on the left side of the axis value of log(E). The above-mentioned Expression (4) is obtained by fitting the logarithm log(Rp) of the average range Rp of the proton and the logarithm log(E) of the acceleration energy of the proton, which are obtained by, for example, experiments, to the quartic of x (=log(Rp)).

When the acceleration energy E of proton implantation is calculated (hereinafter, referred to as a calculated value E) from the desired average range Rp of the proton by the above-mentioned fitting expression represented by the above-mentioned Expression (4) and the proton is implemented into a silicon substrate with the calculated value E of the acceleration energy, the relationship between the actual acceleration energy E' and the average range Rp' (proton peak position) which is actually obtained by the spreading resistance analysis (SR) method may be considered as follows.

When the actual acceleration energy E' is in the range of about E±10% with respect to the calculated value E of the acceleration energy, the actual average range Rp' is in the range of about ±10% of the desired average range Rp, which is in a measurement error range. Therefore, the influence of the deviation of the actual average range Rp' from the desired average range Rp on the electrical characteristics of the diode or the IGBT is small enough to be negligible. When the actual acceleration energy E' is in the range of ±10% of the calculated value E, the actual average range Rp' can be determined to be substantially equal to the set average range Rp. Alternatively, the actual average range Rp' may be in the range of ±10% of the average range Rp which is calculated by substituting the actual acceleration energy E' into the above-mentioned Expression (4).

In the actual accelerator, since both the acceleration energy E and the average range Rp are within the above-mentioned ranges (±10%), it is considered that the actual acceleration energy E' and the actual average range Rp' follow the fitting expression shown in the above-mentioned Expression (4) which is represented by the desired average range Rp and the calculated value E and no problem occurs. In addition, the range of a variation or an error may be in the range of ±10% of the average range Rp. It is preferable that the range of the variation or the error be in the range of ±5% of the average range Rp. In this case, it can be considered that the actual acceleration energy E' and the actual average range Rp' perfectly follow the above-mentioned Expression (4).

The use of the above-mentioned Expression (4) makes it possible to calculate the acceleration energy E of the proton required to obtain the desired average range Rp of the proton. When the above-mentioned Expression (4) is used, the acceleration energy E of each proton for forming the $n^+$ field stop layer is substantially equal to a measured value obtained by actually measuring a sample, which is irradiated with protons with the acceleration energy E', using the spreading resistance analysis (SRA) method. Therefore, the use of the above-mentioned Expression (4) makes it possible to estimate the required acceleration energy E of the proton with high accuracy on the basis of the average range Rp of the proton.

The invention is not limited to the above-described embodiments. The invention can be applied to various semiconductor devices in which the field stop layer can be provided. For example, in Embodiment 1, the trench gate IGBT is given as an example. However, the invention may be applied to a planar gate IGBT. In each of the above-described embodiments, a method for introducing impurities for forming the semiconductor layers (the collector layer and the cathode layer), which are contacts with the output electrode, is not limited to the ion implantation method, but various other methods may be used. In each of the above-described embodiments, the first conductivity type is an n type and the second conductivity type is a p type. However, in the invention, the first conductivity type may be the p type and the second conductivity type may be the n type. In this case, the same effect as described above is obtained.

The invention claimed is:

1. A method for manufacturing a semiconductor device comprising:
   an irradiation step of radiating protons to a rear surface of a semiconductor substrate of a first conductivity type; and
   an annealing step of activating the protons radiated to the rear surface of the semiconductor substrate to form a first semiconductor layer of the first conductivity type which has a higher impurity concentration than an impurity concentration of the semiconductor substrate,
   wherein a set of the irradiation step and the annealing step is performed a plurality of times according to irradiation conditions of the irradiation step to form a plurality of the first semiconductor layers in a depth direction of the semiconductor substrate.

2. The method for manufacturing a semiconductor device according to claim 1, wherein:
   in an irradiation step of the set performed a plurality of times, as a depth of a region, in which the first semiconductor layer is formed, from the rear surface of the semiconductor substrate increases, an acceleration voltage increases,
   in an annealing step of the set performed a plurality of times, as the depth of the region, in which the first semiconductor layer is formed, from the rear surface of the semiconductor substrate increases, an annealing temperature increases, and
   the set of the irradiation step and the annealing step are sequentially performed the plurality of times, starting from a set of the irradiation step and the annealing step by which the first semiconductor layer is formed at a deepest position from the rear surface of the semiconductor substrate.

3. The method for manufacturing a semiconductor device according to claim 1, wherein, in a set of the irradiation step and the annealing step of the plurality of times, one annealing step is performed after a plurality of irradiation steps.

4. The method for manufacturing a semiconductor device according to claim 1, wherein one of the plurality of first semiconductor layers is a field stop layer that suppresses spreading of a depletion layer.

5. The method for manufacturing a semiconductor device according to claim 1, wherein a number of first semiconductor layers formed by the set of the irradiation step and the annealing step performed the plurality of times is based on a thickness of the semiconductor substrate or a rated voltage, or both the thickness of the semiconductor substrate and the rated voltage.

6. The method for manufacturing a semiconductor device according to claim 1, wherein the semiconductor device is an insulated gate bipolar transistor.

7. The method for manufacturing a semiconductor device according to claim 1, wherein the semiconductor device is a diode.

8. The method for manufacturing a semiconductor device according to claim 1, wherein:
- a drift layer of the first conductivity type which is the semiconductor substrate is provided,
- a second semiconductor layer of a second conductivity type is formed on a front surface of the semiconductor substrate,
- when q is an elementary charge, $N_d$ is an average concentration of the drift layer, $\varepsilon_s$ is a permittivity of the semiconductor substrate, $V_{rate}$ is a rated voltage, $J_F$ is rated current density, and $v_{sat}$ is a saturated speed at which a speed of carriers is saturated with predetermined electric field intensity, a distance index L is represented by the following Expression (1):

$$L = \sqrt{\frac{\varepsilon_S V_{rate}}{q\left(\frac{J_F}{q v_{sat}} + N_d\right)}}, \quad \text{[Expression 1]}$$

and
- when a depth of a position where a carrier concentration of a first semiconductor layer of the plurality of first semiconductor layers closest to the second semiconductor layer is a peak concentration from the rear surface of the semiconductor substrate is X and a thickness of the semiconductor substrate is $W_0$, the position where the carrier concentration of the first semiconductor layer of the plurality of first semiconductor layers closest to the second semiconductor layer is the peak concentration is set such that $X=W_0-\gamma L$ is established and $\gamma$ is equal to or greater than 0.2 and equal to or less than 1.5.

9. The method for manufacturing a semiconductor device according to claim 8, wherein $\gamma$ is equal to or greater than 0.9 and equal to or less than 1.4.

10. The method for manufacturing a semiconductor device according to claim 9, wherein $\gamma$ is equal to or greater than 1.0 and equal to or less than 1.3.

11. A method for manufacturing a semiconductor device comprising:
- an irradiation step of radiating protons to a rear surface of a semiconductor substrate of a first conductivity type; and
- an annealing step of activating the proton radiated to the rear surface of the semiconductor substrate to form a first semiconductor layer of the first conductivity type which has a higher impurity concentration than an impurity concentration of the semiconductor substrate, wherein:
- a set of the irradiation step and the annealing step is performed a plurality of times to form a plurality of the first semiconductor layers in a depth direction of the semiconductor substrate,
- in a first annealing step among the plurality of annealing steps, which forms a set together with a first irradiation step of radiating the protons to a deepest position from the rear surface of the semiconductor substrate among the plurality of irradiation steps, an annealing temperature is equal to or higher than 380° C. and equal to or lower than 450° C.,
- in a second annealing step among the plurality of annealing steps, which forms a set together with a second irradiation step of radiating the protons to a second deepest position from the rear surface of the semiconductor substrate among the plurality of irradiation steps, the annealing temperature is equal to or higher than 350° C. and equal to or lower than 420° C., and
- in a third annealing step among the plurality of annealing steps, which forms a set together with a third irradiation step of radiating the protons to a third deepest position from the rear surface of the semiconductor substrate among the plurality of irradiation steps, the annealing temperature is equal to or higher than 340° C. and equal to or lower than 400° C.

12. The method for manufacturing a semiconductor device according to claim 11, wherein:
- in the first annealing step, the annealing temperature is equal to or higher than 400° C. and equal to or lower than 420° C.,
- in the second annealing step, the annealing temperature is equal to or higher than 370° C. and equal to or lower than 390° C., and
- in the third annealing step, the annealing temperature is equal to or higher than 350° C. and equal to or lower than 370° C.

13. A method for manufacturing a semiconductor device comprising:
- an irradiation step of radiating protons to a rear surface of a semiconductor substrate of a first conductivity type; and
- an annealing step of activating the protons radiated to the rear surface of the semiconductor substrate to form a first semiconductor layer of the first conductivity type which has a higher impurity concentration than an impurity concentration of the semiconductor substrate,
- wherein a set of one or more irradiation steps and one annealing step is performed a plurality of times according to irradiation conditions of the irradiation step to form a plurality of the first semiconductor layers in a depth direction of the semiconductor substrate.

14. The method for manufacturing a semiconductor device according to claim 1, wherein, in an irradiation step of the one or more irradiation steps, acceleration energy E of the protons when the first semiconductor layer with a range Rp is formed by the radiation of the protons satisfies the following Expression (2):

$$y=-0.0047x^4+0.0528x^3-0.2211x^2+0.9923x+5.0474 \quad \text{[Expression (2)]}$$

(where x is a logarithm log(Rp) of the range Rp and y is a logarithm log(E) of the acceleration energy E).

15. The method for manufacturing a semiconductor device according to claim 1, wherein a range of the protons from the rear surface of the semiconductor substrate is equal to or greater than 15 μm.

16. The method for manufacturing a semiconductor device according to claim 1, further comprising:
- a step of thinning the semiconductor substrate and implanting impurity ions for forming a semiconductor layer, which is a contact with a rear surface electrode, into the rear surface of the thinned semiconductor substrate; and
- a step of forming the rear surface electrode on the rear surface of the semiconductor substrate,
- wherein the annealing step is performed after the step of forming the rear surface electrode.

17. The method for manufacturing a semiconductor device according to claim 1, wherein, as acceleration energy in the plurality of proton irradiation steps increases, a dose of the proton irradiation is reduced.

* * * * *